(12) United States Patent
Choi et al.

(10) Patent No.: US 11,424,202 B2
(45) Date of Patent: Aug. 23, 2022

(54) SEMICONDUCTOR DEVICES HAVING LANDING PADS

(71) Applicant: Samsung Electronics Co., Ltd., Suwon-si (KR)

(72) Inventors: Bowo Choi, Suwon-si (KR); Youngtak Kim, Hwaseong-si (KR); Sangjine Park, Suwon-si (KR); Suji Kim, Yongin-si (KR); Jaeuk Shin, Suwon-si (KR); Hyunjung Lee, Goyang-si (KR); Jihun Cheon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 143 days.

(21) Appl. No.: 16/674,056

(22) Filed: Nov. 5, 2019

(65) Prior Publication Data

US 2020/0365537 A1    Nov. 19, 2020

(30) Foreign Application Priority Data

May 13, 2019 (KR) .......................... 10-2019-0055520

(51) Int. Cl.
*H01L 27/108* (2006.01)
*H01L 23/00* (2006.01)

(52) U.S. Cl.
CPC ........ *H01L 24/05* (2013.01); *H01L 27/10814* (2013.01); *H01L 27/10823* (2013.01); *H01L 27/10855* (2013.01); *H01L 27/10876* (2013.01); *H01L 27/10885* (2013.01); *H01L 27/10891* (2013.01)

(58) Field of Classification Search
CPC ......... H01L 27/10814; H01L 27/10823; H01L 27/10855; H01L 27/10885; H01L 27/10891
See application file for complete search history.

(56) References Cited

U.S. PATENT DOCUMENTS

| | | | |
|---|---|---|---|
| 7,393,742 B2 * | 7/2008 | Park | ..................... H01L 28/90 257/E21.018 |
| 7,476,585 B2 | 1/2009 | Cho et al. | |
| 7,745,865 B2 * | 6/2010 | Tu | ........................... H01L 28/60 257/311 |
| 7,842,603 B2 | 11/2010 | Han et al. | |
| 7,867,902 B2 | 1/2011 | Choi et al. | |

(Continued)

FOREIGN PATENT DOCUMENTS

| KR | 10-2006-0000681 A | 1/2006 |
|---|---|---|
| KR | 10-2010-0039688 A | 4/2010 |

*Primary Examiner* — Phat X Cao
(74) *Attorney, Agent, or Firm* — Muir Patent Law, PLLC

(57) ABSTRACT

A semiconductor device includes a landing pad, a first insulating pattern in contact with a lower portion of a side surface of the landing pad, a pad oxide layer having a lateral portion disposed on a portion of an upper surface of the landing pad and a vertical portion in contact with an upper portion of the side surface of the landing pad, a second insulating pattern in contact with an upper surface of the first insulating pattern and covering the first insulating pattern and the pad oxide layer, and a lower electrode that vertically passes through the second insulating pattern and is in contact with a portion of the upper surface and an upper portion of a side surface of the landing pad.

20 Claims, 18 Drawing Sheets

(56) References Cited

U.S. PATENT DOCUMENTS

| | | | |
|---|---|---|---|
| 2004/0232462 A1* | 11/2004 | Takeuchi | H01L 21/76877 257/296 |
| 2013/0082393 A1* | 4/2013 | Kawamura | H01L 21/28568 257/773 |
| 2013/0292847 A1* | 11/2013 | Choi | H01L 45/146 257/774 |
| 2014/0151893 A1* | 6/2014 | Boyanov | H01L 23/5226 257/774 |
| 2018/0040560 A1* | 2/2018 | Kim | H01L 21/764 |
| 2020/0006128 A1* | 1/2020 | Weng | H01L 21/76877 |

\* cited by examiner

SEMICONDUCTOR DEVICES HAVING LANDING PADS

CROSS-REFERENCE TO RELATED APPLICATION

This application claims priority under 35 U.S.C. § 119 to Korean Patent Application No. 10-2019-0055520, filed on May 13, 2019, the disclosure of which is incorporated herein by reference in its entirety.

BACKGROUND

1. Field

The present disclosure relates to semiconductor devices having landing pads.

2. Description of Related Art

Due to demands for miniaturization and weight reduction of semiconductor devices, circuit patterns of semiconductor devices have been downscaled. With a reduction in design rules, sizes of lower electrodes of capacitors have decreased, and aspect ratios have increased. Thus, resistances of the lower electrodes may increase, and/or device reliability may decrease.

SUMMARY

Example embodiments of the inventive concept provide a semiconductor device including a landing pad and an electrode connected to the landing pad.

According to example embodiments, there is provided a semiconductor device including a landing pad, a first insulating pattern in contact with a lower portion of a first side surface of the landing pad, a pad oxide layer having a lateral portion disposed on a portion of an upper surface of the landing pad and a vertical portion in contact with an upper portion of the first side surface of the landing pad, a second insulating pattern in contact with an upper surface of the first insulating pattern and covering the first insulating pattern and the pad oxide layer, and a lower electrode that vertically passes through the second insulating pattern and is in contact with a portion of the upper surface and an upper portion of a second side surface of the landing pad, the second side surface opposite to the first side surface.

According to example embodiments, there is provided a semiconductor device including a plurality of landing pads, a plurality of first insulating patterns in contact with lower portions of first side surfaces of the plurality of landing pads, a plurality of pad oxide layers each of which includes a lateral portion disposed on an upper surface of one of the plurality of landing pads and a vertical portion in contact with an upper portion of a first side surface of the one of the plurality of landing pads, a plurality of second insulating patterns in contact with upper surfaces of the plurality of first insulating patterns and covering the plurality of first insulating patterns and the plurality of pad oxide layers, and a plurality of lower electrodes vertically passing through the plurality of second insulating patterns, each of the plurality of lower electrodes having a first portion in contact with a second side surface of the one of the plurality of landing pads and a second portion disposed between the plurality of second insulating patterns, the second side surface opposite to the first side surface. A lateral width of the first portion is less than a lateral width of the second portion.

According to example embodiments, there is provided a semiconductor device including a substrate including a plurality of active regions and a plurality of word lines crossing the plurality of active regions and extending in a first direction, a plurality of bit lines disposed on the substrate and extending in a second direction intersecting the first direction, a plurality of storage node contacts disposed between the plurality of bit lines and between the plurality of word lines and connected to the plurality of active regions, a plurality of landing pads disposed on the plurality of storage node contacts, a plurality of first insulating patterns in contact with lower portions of first side surfaces of the plurality of landing pads, a plurality of pad oxide layers, each of which having a lateral portion disposed on an upper surface of one of the plurality of landing pads and a vertical portion in contact with an upper portion of a side surface of the one of the plurality of landing pads, a plurality of second insulating patterns in contact with upper surfaces of the plurality of first insulating patterns and covering the plurality of first insulating patterns and the plurality of pad oxide layers, and a plurality of lower electrodes vertically passing through the plurality of second insulating patterns and in contact with the upper surfaces and upper portions of second side surfaces of the plurality of landing pads, the second side surfaces opposite to the first side surfaces.

BRIEF DESCRIPTION OF THE DRAWINGS

The above and other objects, features, and advantages of the inventive concept will become more apparent to those of ordinary skill in the art by describing exemplary embodiments thereof in detail with reference to the accompanying drawings, in which:

FIGS. 8A-12A, 8B-12B, 13, 14A, 14B, and 15-22 are views illustrating steps of a process and/or a sequence of a method of manufacturing a semiconductor device according to an example embodiment.

DETAILED DESCRIPTION OF EXEMPLARY EMBODIMENTS

Figure 1:
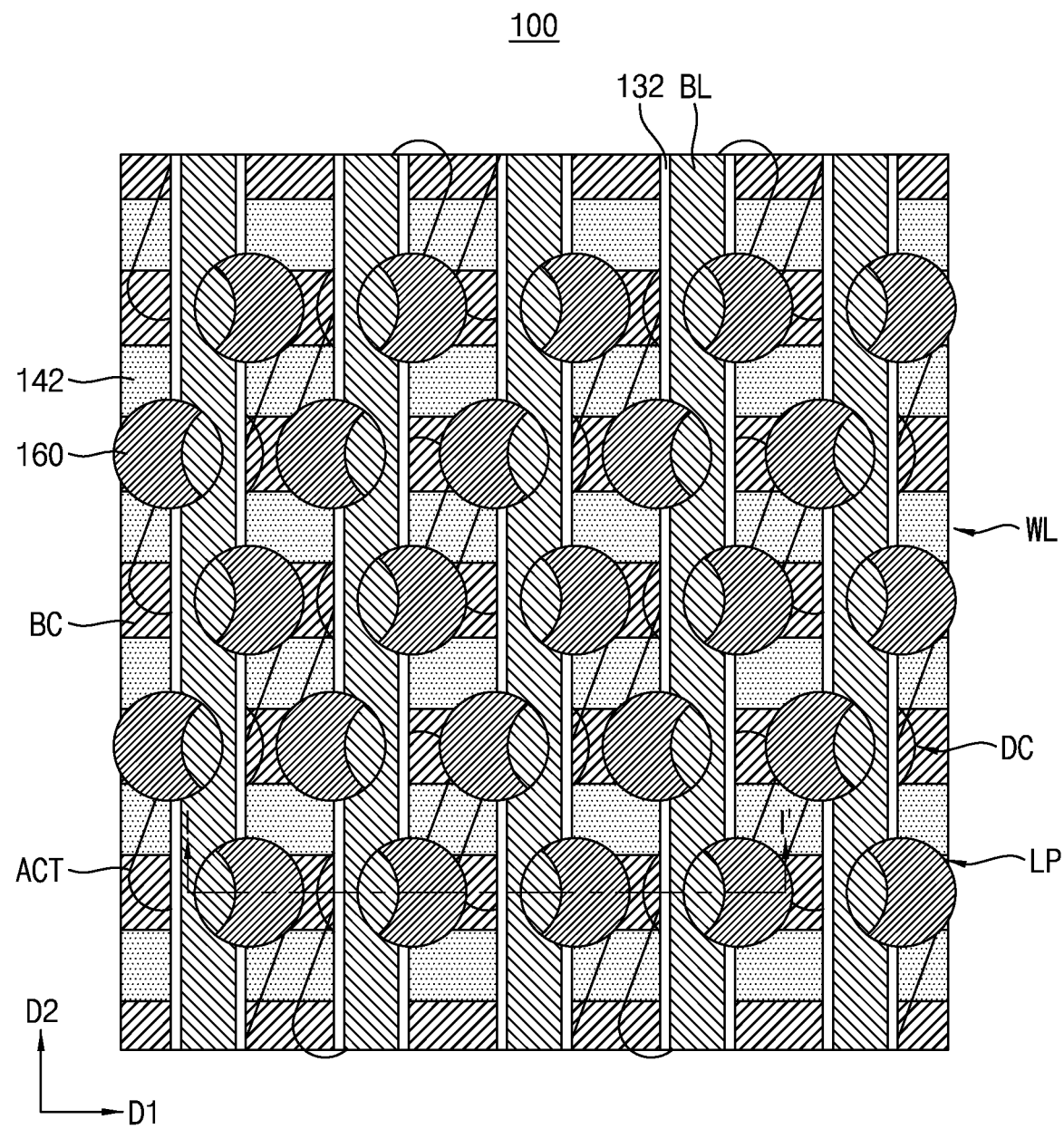
FIG. 1 is a plan view illustrating a semiconductor device 100 according to an example embodiment.
Figure 2:
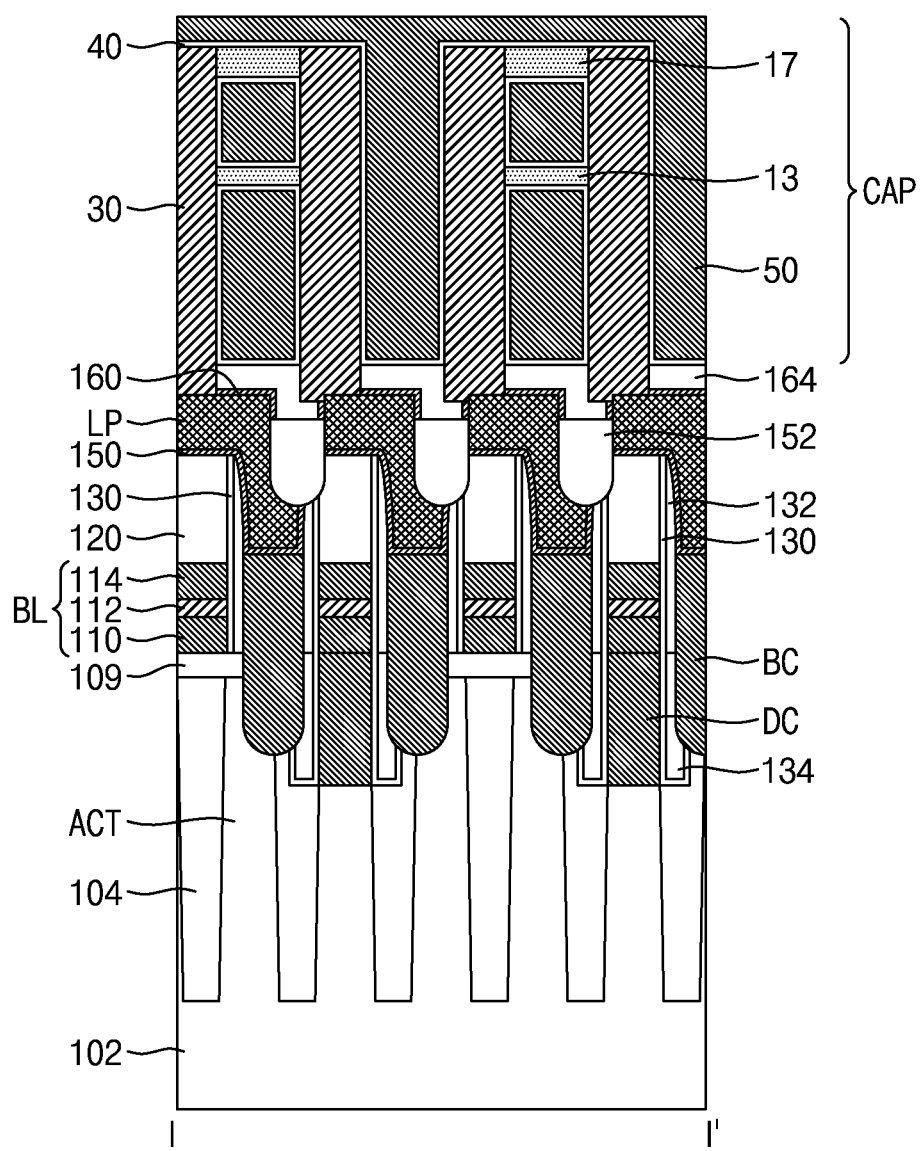
FIG. 2 is a vertical cross-sectional view taken along line I-I' of the semiconductor device 100 of FIG. 1.

FIG. 1 is a plan view illustrating a semiconductor device 100 according to an example embodiment. FIG. 2 is a vertical cross-sectional view taken along line I-I' of the semiconductor device 100 of FIG. 1.

Referring to FIGS. 1 and 2, the semiconductor device 100 may include a substrate 102. The substrate 102 may include a semiconductor material. For example, the substrate 102 may be a silicon (Si) substrate, a germanium (Ge) substrate, a silicon germanium (SiGe) substrate, or a silicon-on-insulator (SOI) substrate. A plurality of device isolation layers 104 may be disposed in the substrate 102. The device isolation layers 104 may have a shallow trench isolation (STI) structure and may include an insulating material. For example, the device isolation layers 104 may include silicon oxide. The device isolation layers 104 may define active regions ACT. Each active region ACT may have a bar shape extending in one direction. The active regions ACT may be isolated from each other and disposed to be spaced apart from each other by a predetermined distance. Each active region ACT may include an impurity region. The impurity region may have an N conductivity type and may include a source region or a drain region.

A buffer layer 109 may be disposed on an upper surface of the substrate 102. The buffer layer 109 may cover the upper surface of the substrate 102. The buffer layer 109 may include silicon oxide, silicon nitride, silicon oxynitride, or a combination thereof and be formed as a single layer or a multilayered structure.

A word line WL may be disposed to be buried in the substrate 102. Word lines WL may extend in a first direction D1 and be disposed to be spaced apart from each other in a second direction D2. Two adjacent word lines WL may be disposed to intersect/cross each of the active regions ACT (e.g., from a plan view). The word line WL may include a conductive material and may include, for example, doped polysilicon, a metal material, such as tungsten, or a metal silicide material.

A bit line node contact DC may pass through the buffer layer 109 and may be disposed on the impurity region. The upper surface of the substrate 102 may be recessed such that a lower surface of the bit line node contact DC is at a lower level than the upper surface of the substrate 102. For example, the lower surface of the bit line node contact DC may be at a lower level than an adjacent portion of the upper surface of the substrate 102. The bit line node contact DC may be formed to have a lateral width greater than a lateral width of the impurity region and may be electrically connected to the impurity region. The bit line node contact DC may include a conductive material and may include, for example, doped polysilicon, a metal, or a metal silicide.

A bit line BL may be disposed on the bit line node contact DC. The bit line BL may be formed to extend in a second direction D2. The bit line BL may include a first conductive pattern 110, a second conductive pattern 112, and a third conductive pattern 114, which are sequentially stacked. The first conductive pattern 110 may include doped polysilicon. The second conductive pattern 112 may include a metal silicide, such as cobalt silicide or titanium silicide or a nitride, such as a metal nitride including aluminum nitride and titanium nitride, and aluminum titanium nitride. The third conductive pattern 114 may include a metal such as tungsten, aluminum, copper, nickel, and cobalt.

A capping pattern 120 may be disposed on the bit line BL and may extend in the second direction D2. The capping pattern 120 may include silicon nitride or silicon oxynitride.

A storage node contact BC may be disposed between two bit lines BL and may be disposed on both edges of an active region ACT. The storage node contact BC may be formed to pass through the capping pattern 120 and may be electrically connected to impurity regions. An upper surface of the storage node contact BC may be disposed at a lower level than an upper surface of the capping pattern 120. For example, the upper surface of the storage node contact BC may be disposed at a lower level than an upper surface of an adjacent/corresponding capping pattern 120. A lower end of the storage node contact BC may be disposed at a lower level than the upper surface of the substrate 102. For example, the lower end of the storage node contact BC may be disposed at a lower level than an upper surface of an adjacent/corresponding portion of the substrate 102. In an example embodiment, the storage node contact BC may include doped polysilicon.

First spacers 130 may include a pair of structures which are formed on side surfaces of the bit line BL and opposite each other with the bit line node contact DC and the bit line BL disposed therebetween. For example, the first spacers 130 may also be formed on and/or extend to the side surfaces of the bit line node contact DC. For example, portions of the first spacers 130 may be in contact with the bit line node contact DC and the device isolation layers 104. Second spacers 132 may be formed on side surfaces of the bit line BL and the capping pattern 120 and disposed outside the first spacers 130. For example, each of the first spacers 130 may be disposed between a second spacer 132 and a bit line BL/a capping pattern 120. Third spacers 134 may be respectively disposed between bit line node contacts DC and storage node contacts BC. For example, each of the third spacers 134 may be disposed between a bit line node contact DC and a storage node contact BC. The second spacer 132 may be formed on top of a third spacer 134. For example, the third spacer 134 may be in contact with the second spacer 132 formed on the third spacer 134. Upper surfaces of the third spacers 134 may be disposed at the same level as an upper surface of the buffer layer 109. The third spacers 134 may cover portions of the first spacers 130. For example, the third spacers 134 may be in contact with the first spacers 130. Items described as "contacting" or "in contact with" each other have no intervening components at the point of contact (e.g., are touching).

The first spacers 130 and the second spacers 132 may include a single layer or a multilayered structure and may include silicon oxide, silicon nitride, or silicon oxynitride. The third spacers 134 may include a material having an etch selectivity with respect to the buffer layer 109 and may include, for example, silicon oxide, silicon nitride, or silicon oxynitride.

An isolated pattern 142 may be disposed between the bit lines BL. For example, the isolated pattern 142 may be disposed in a portion intersecting the word line WL between the bit lines BL, e.g., in a plan view. For example the isolated pattern 142 may vertically overlap the word line WL. The isolated pattern 142 may include any one of silicon boron carbonitride (SiBCN), silicon carbonitride (SiCN), silicon oxycarbonitride (SiOCN), and silicon nitride (SiN).

A barrier pattern 150 may cover the capping pattern 120 and the storage node contact BC. A landing pad LP may be disposed on the barrier pattern 150. For example, both of the barrier pattern 150 and the landing pad LP may vertically overlap the capping pattern 120 and the storage node contact BC. In an example embodiment, a metal silicide may be further disposed between the barrier pattern 150 and the storage node contact BC. The barrier pattern 150 may include titanium nitride (TiN), titanium/titanium nitride (Ti/TiN), titanium silicon nitride (TiSiN), tantalum nitride (TaN), or tungsten nitride (WN). The landing pad LP may include tungsten.

A first insulating pattern 152 may be disposed between landing pads LP. A lower surface of the first insulating pattern 152 may be in contact with the capping pattern 120, the first spacers 130, the second spacers 132, and the barrier pattern 150. The first insulating pattern 152 may be in contact with a portion of a side surface of the landing pad LP. For example, an upper surface of the first insulating pattern 152 may be disposed at a lower level than an upper surface of the landing pad LP. For example, the upper surface of the first insulating pattern 152 may be disposed at a lower level than an upper surface of an adjacent/corresponding landing pad LP. The first insulating pattern 152 may electrically insulate the landing pads LP from each other. The formation of the first insulating pattern 152 may include recessing the upper surface of the landing pad LP and filling a recessed portion of the landing pad LP with an insulating material.

The first insulating pattern 152 may include silicon oxide, silicon nitride, or silicon oxynitride. In an example embodiment, the first insulating pattern 152 may include silicon nitride.

A pad oxide layer 160 may be disposed on the upper surface and a side surface of the landing pad LP. A second insulating pattern 164 may cover the first insulating pattern 152 and the pad oxide layer 160. For example, the second insulating pattern 164 may vertically overlap and contact the pad oxide layer 160 and the first insulating pattern 152.

A capacitor CAP may be disposed on the landing pad LP. The capacitor CAP may be misaligned with the storage node contact BC and the landing pad LP. For example, edge lines of a lower electrode of the capacitor CAP may not be aligned with edge lines of the storage node contact BC and with edge lines of the landing pad LP in a cross-sectional view. The capacitor CAP may include a lower electrode 30, a capacitor dielectric layer 40, and an upper electrode 50. Although the lower electrode 30 illustrated in FIG. 2 has a pillar shape, the inventive concept is not limited thereto, and the lower electrode 30 may have a cylindrical shape in certain embodiments. The lower electrode 30 may be electrically connected to the landing pad LP and include niobium oxide (NbO), a metal, such as titanium (Ti) or tungsten (W), or a metal nitride such as titanium nitride (TiN), tungsten nitride (WN), niobium nitride (NbN), or the like. The capacitor dielectric layer 40 may be conformally disposed on surfaces of the lower electrode 30 and the second insulating pattern 164. For example, the capacitor dielectric layer 40 may cover an upper surface and a side surface of the lower electrode 30 and an upper surface of the second insulating pattern 164. The capacitor dielectric layer 40 may include a metal oxide having a high dielectric constant such as hafnium oxide (HfOx), zirconium oxide (ZrOx), hafnium zirconium oxide (HfZrO), or the like. An upper electrode 50 may be disposed on the capacitor dielectric layer 40 and may include niobium oxide (NbO), a metal, such as titanium (Ti), tungsten (W), tantalum (Ta), ruthenium (Ru), or the like, or a metal nitride such as tungsten nitride (WN), tantalum nitride (TaN), niobium nitride (NbN), or the like.

Figure 3:
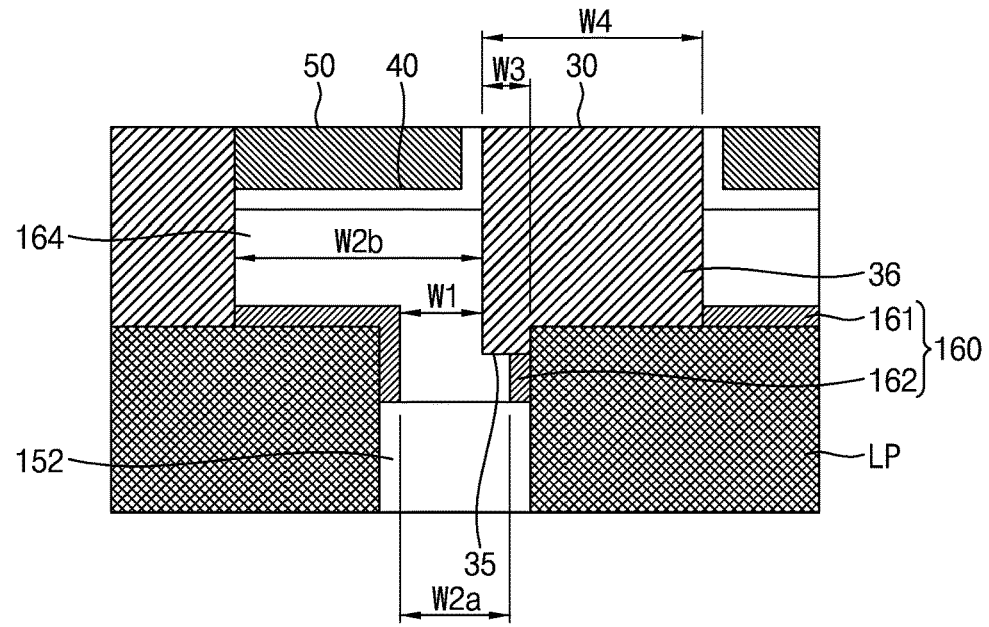
FIG. 3 is a partial enlarged view of the semiconductor device 100 shown in FIG. 2.

FIG. 3 is a partial enlarged view of the semiconductor device 100 shown in FIG. 2.

Referring to FIG. 3, the semiconductor device 100 according to the example embodiment may include a first insulating pattern 152, a landing pad LP, a pad oxide layer 160, and a second insulating pattern 164. The semiconductor device 100 may further include a lower electrode 30, a capacitor dielectric layer 40, and an upper electrode 50.

The pad oxide layer 160 may include a lateral portion 161, which is in contact with an upper surface of the landing pad LP, and a vertical portion 162 which is in contact with a side surface of the landing pad LP. The pad oxide layer 160 may partially cover the upper surface and the side surface of the landing pad LP to expose a portion of the upper surface and a portion of the side surface of the landing pad LP. For example, the lateral portion 161 of the pad oxide layer 160 may partially cover the upper surface of the landing pad LP. The vertical portion 162 of the pad oxide layer 160 may partially cover the side surface of the landing pad LP. In an example embodiment, the landing pad LP may include tungsten, and the pad oxide layer 160 may include tungsten oxide.

The second insulating pattern 164 may be disposed between the lower electrodes 30 and between the landing pads LP. For example, the second insulating pattern 164 may horizontally overlap the lower electrodes 30 disposed on both sides of the second insulating pattern 164, and the second insulating pattern 164 may also horizontally overlap the landing pads LP disposed on both sides of the second insulating pattern 164. For example, the second insulating pattern 164 may extend from between the lower electrodes 30 to between the landing pads LP. Accordingly, the second insulating pattern 164 may fill a space between the lower electrodes 30 and a space between the landing pads LP. In an example embodiment, an upper surface of the first insulating pattern 152 may be recessed with respect to an upper surface of the landing pads LP. For example, the upper surface of the first insulating pattern 152 may be lower than upper surfaces of the landing pads LP disposed on both sides of the first insulating pattern 152. The second insulating pattern 164 may be formed on the upper surface of the first insulating pattern 152 recessed between the landing pads LP. An upper surface of the second insulating pattern 164 may be in contact with the capacitor dielectric layer 40, and a lower surface of the second insulating pattern 164 may be in contact with the first insulating pattern 152. The second insulating pattern 164 may cover the first insulating pattern 152 and the pad oxide layer 160. For example, the second insulating pattern 164 may cover a lateral portion 161 and a vertical portion 162 of the pad oxide layer 160. For example, the insulating pattern 164 may be in contact with the lateral portion 161 and the vertical portion 162 of the pad oxide layer 160. The second insulating pattern 164 may be in contact with a lower surface and a lower side surface of the lower electrode 30. In a vertical sectional view, the second insulating pattern 164 may have a middle lateral width W1 between the lower electrode 30 and the pad oxide layer 160, an upper lateral width W2b between adjacent lower electrodes 30, and a lower lateral width W2a between adjacent pad oxide layers 160. The middle lateral width W1 may be less than the upper lateral width W2b and the lower lateral width W2a. The lower lateral width W2a may be less than the upper lateral width W2b. A lower surface of the second insulating pattern 164 may be disposed at a lower level than the upper surface of the landing pad LP. For example, the lower surface of the second insulating pattern 164 may be disposed at a lower level than an upper surface of an adjacent/corresponding landing pad LP. In an example embodiment, the first insulating pattern 152 and the second insulating pattern 164 may include silicon nitride, silicon oxynitride, or a combination thereof.

The lower electrode 30 may pass through the second insulating pattern 164 and may be connected to the landing pad LP. In an example embodiment, an axis of the lower electrode 30 vertically passing through a center of the lower electrode 30 may be misaligned with respect to an axis of the landing pad LP vertically passing through a center of the landing pad LP. The lower electrode 30 may be in contact with the portion of the upper surface and the portion of the side surface of the landing pad LP, which are exposed by the lateral portion 161 and the vertical portion 162 of the pad oxide layer 160. For example, the lower electrode 30 may include a first portion 35, which is in contact with the side surface of the landing pad LP, e.g., a portion disposed between two landing pads LP, and a second portion 36 which is disposed between the second insulating patterns 164. A lateral width W3 of the first portion 35 of the lower electrode 30 may be less than a lateral width W4 of the second portion 36 of the lower electrode 30. A lower surface of the first portion 35 of the lower electrode 30 may be disposed at a lower level than the upper surface of the landing pad LP. For example, the lower surface of the first portion 35 of the lower electrode 30 may be disposed at a lower level than an upper surface of an adjacent/corresponding landing pad LP.

Further, the lower electrode 30 may be in contact with the lateral portion 161 and the vertical portion 162 of the pad oxide layer 160. As shown in FIG. 3, the lower electrode 30 may be in contact with the upper surface of the landing pad LP and be in contact with the side surface of the landing pad LP. Accordingly, since a contact area between the lower electrode 30 and the landing pad LP is increased, a contact resistance between the lower electrode 30 and the landing pad LP may be reduced.

FIGS. 4 to 7 are partial enlarged views of a semiconductor device 100 according to example embodiments.

Figure 4:
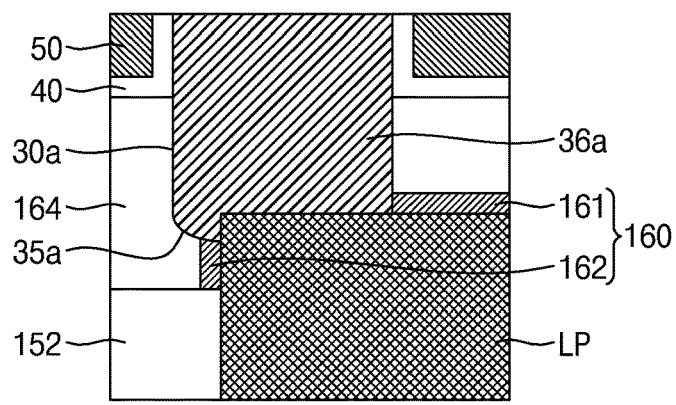
FIGS. 4 to 7 are partial enlarged views of a semiconductor device 100 according to example embodiments.

Referring to FIG. 4, a semiconductor device 100 according to an example embodiment may include a lower electrode 30a which is in contact with a portion of an upper surface and a portion of a side surface of a landing pad LP. The lower electrode 30a may include a first portion 35a, which is in contact with the side surface of the landing pad LP and/or disposed between two adjacent landing pads LP, and a second portion 36a which is disposed between second insulating patterns 164, e.g., in a cross-sectional view. The lower electrode 30a may be formed to pass through the second insulating pattern 164. In an example embodiment, the second insulating pattern 164 may be over-etched, and a lower surface of the first portion 35a of the lower electrode 30a may be rounded, e.g., in a cross-sectional view. A lower end of the first portion 35a of the lower electrode 30a may be disposed at a lower level than the upper surface of the landing pad LP. For example, the lower end of the first portion 35a of the lower electrode 30a may be disposed at a lower level than an upper surface of an adjacent/corresponding landing pad LP. The lower electrode 30a may be in contact with the upper surface and the side surface of the landing pad LP.

Figure 5:
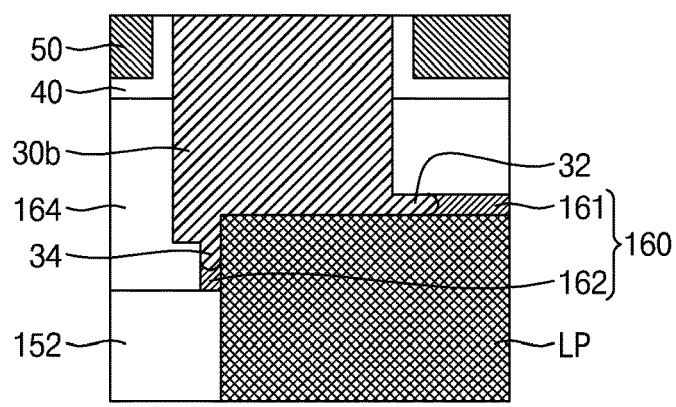

Referring to FIG. 5, a semiconductor device 100 according to an example embodiment may include a lower electrode 30b which is in contact with a portion of an upper surface and a portion of a side surface of a landing pad LP. A portion of the lower electrode 30b which is in contact with the landing pad LP may partially protrude. For example, the lower electrode 30b may include a lateral protrusion 32, which is in contact with the upper surface of the landing pad LP, and a vertical protrusion 34 which is in contact with the side surface of the landing pad LP. The lateral protrusion 32 and the vertical protrusion 34 may further increase a contact area between the lower electrode 30b and the landing pad LP and may reduce a resistance of the capacitor CAP. In an example embodiment, the lateral protrusion 32 may have a convex shape toward a pad oxide layer 160 in a lateral direction. The vertical protrusion 34 may have a convex shape toward a first insulating pattern 152 in a vertical direction.

A vertical thickness of the lateral protrusion 32 may be substantially equal to a vertical thickness of a lateral portion 161 of the pad oxide layer 160. A lateral thickness of the vertical protrusion 34 may be substantially equal to a lateral thickness of a vertical portion 162 of the pad oxide layer 160. The vertical portion 162 of the pad oxide layer 160 may be disposed between the vertical protrusion 34 and the first insulating pattern 152. A lower end of the vertical protrusion 34 of the pad oxide layer 160 may be disposed at a higher level than an upper surface of the first insulating pattern 152. For example, the lower end of the vertical protrusion 34 of the pad oxide layer 160 may be disposed at a higher level than an upper surface of an adjacent portion of the first insulating pattern 152. In an example embodiment, the vertical protrusion 34 may be in contact with the upper surface of the first insulating pattern 152.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, encompass acceptable variations from exact identicality, including nearly identical layout, location, shapes, sizes, amounts, or other measures within acceptable variations that may occur, for example, due to manufacturing processes. The term "substantially" may be used herein to emphasize this meaning, unless the context or other statements indicate otherwise.

Figure 6:
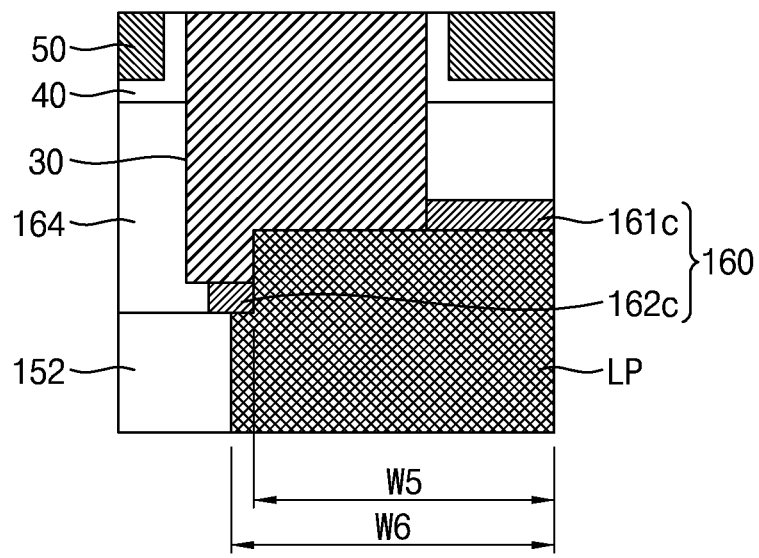

Referring to FIG. 6, a semiconductor device 100 according to an example embodiment may include a landing pad LP and a pad oxide layer 160. The pad oxide layer 160 may include a lateral portion 161c, which is in contact with an upper surface of the landing pad LP, and a vertical portion 162c which is in contact with a side surface of the landing pad LP. In an example embodiment, the pad oxide layer 160 may be formed by oxidizing the landing pad LP. The pad oxide layer 160 may be formed in an inward direction and an outward direction on the basis of a surface of the landing pad LP. For example, the pad oxide layer 160 may protrude outward with respect to surfaces of the landing pad LP in some embodiments. In certain embodiments, outer surfaces of the pad oxide layer 160 may be at the same level as the surfaces of the landing pad LP. An upper lateral width W5 of the landing pad LP may be less than a lower lateral width W6 of the landing pad LP on the basis of the upper surface of the first insulating pattern 152. For example, a step may be formed in the side surface of the landing pad LP at the same level as the upper surface of the first insulating pattern 152. For example, the width of the landing pad LP above the level of the upper surface of the first insulating pattern 152 may be less than the width of the landing pad LP below the level of the upper surface of the first insulating pattern 152 so that a step/offset structure may be formed in the landing pad LP at the level of the upper surface of the first insulating pattern 152. A lower surface of the vertical portion 162c of the pad oxide layer 160 may be in contact with the landing pad LP.

Figure 7:
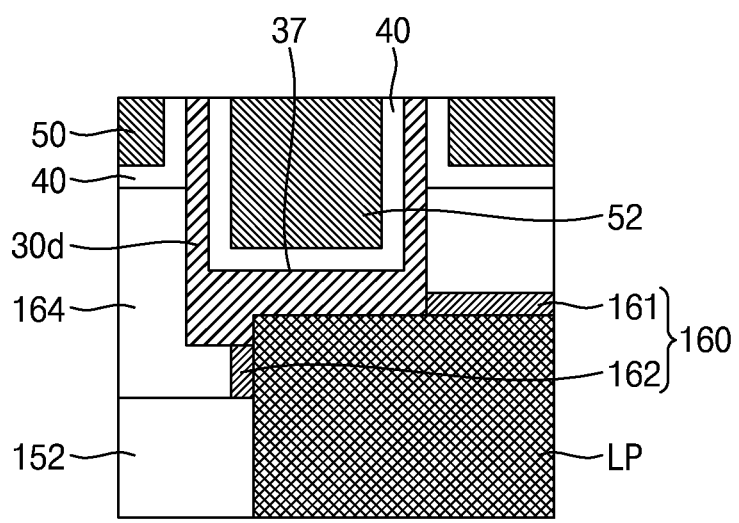

Referring to FIG. 7, a semiconductor device 100 according to an example embodiment may include a lower electrode 30d which is in contact with a portion of an upper surface and a portion of a side surface of a landing pad LP. The lower electrode 30d may have a cylindrical shape. For example, an inner lower surface 37 of the lower electrode 30d may be disposed at a lower level than an upper surface of a second insulating pattern 164. For example, the inner lower surface 37 of the lower electrode 30d may be disposed at a lower level than an upper surface of an adjacent/closest portion of the second insulating pattern 164. A portion of a capacitor dielectric layer 40, which is in contact with the inner lower surface 37 of the lower electrode 30, may be disposed at a lower level than the upper surface (e.g., of an adjacent/closest portion) of the second insulating pattern 164. Further, an upper electrode 50 may include a filling portion 52 which fills an inner lower portion of the lower electrode 30d. A lower surface of the filling portion 52 may be disposed at a lower level than the upper surface (e.g., of an adjacent/closest portion) of the second insulating pattern 164.

FIGS. 8A to 22 are views illustrating steps of a process and/or a sequence of a method of manufacturing a semiconductor device according to an example embodiment.

FIGS. 8A to 12A and 14A are plan views according to the steps of the process and/or the sequence of the manufacturing method. FIGS. 8B to 12B, 13, and 14 are cross-sectional views according to the steps of the process and/or the sequence of the manufacturing method. FIGS. 8B to 12B and 14B are vertical cross-sectional views taken along lines I-I' and II-II' of FIGS. 8A to 12A and 14A, respectively. FIGS. 15 to 22 are vertical cross-sectional views according to the steps of the process and/or the sequence of the manufacturing method.

Figure 8A:
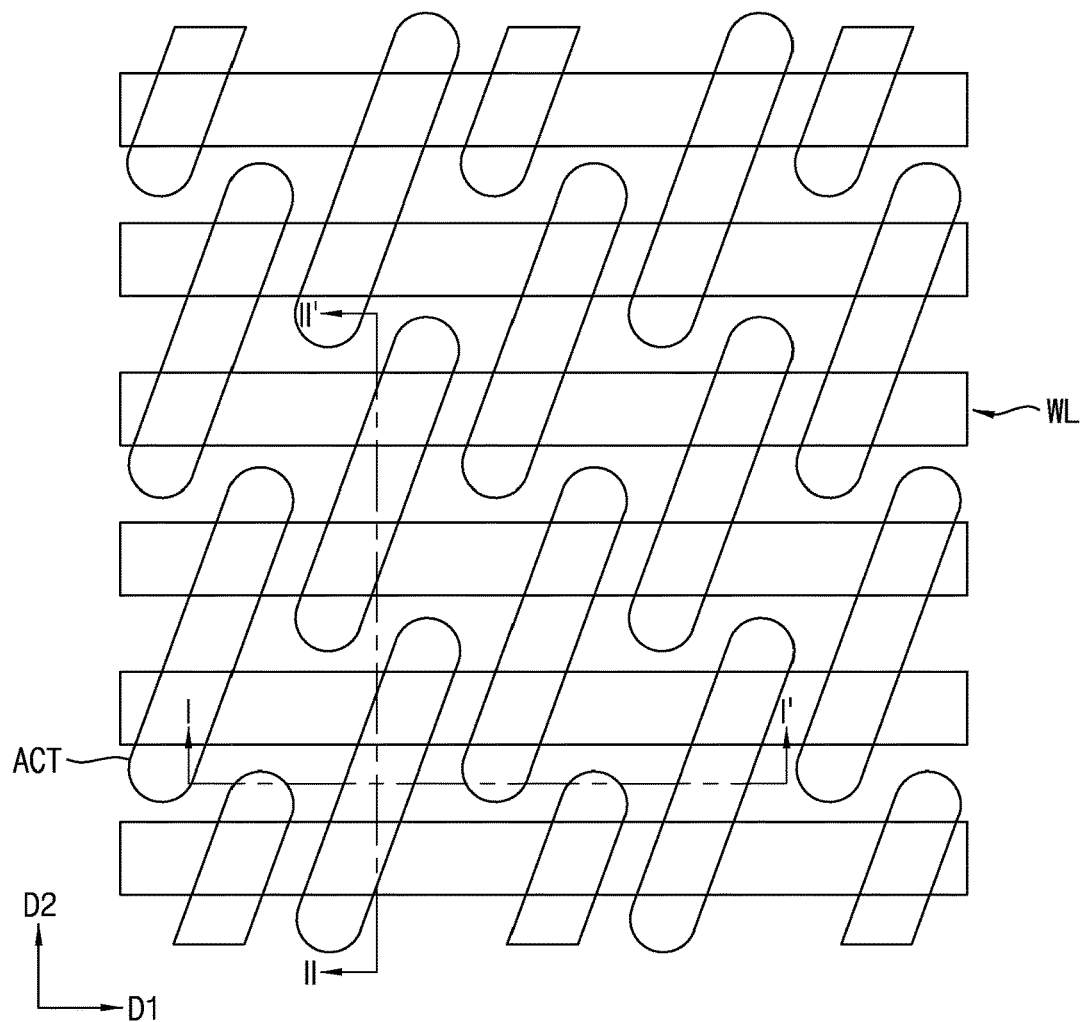
Figure 8B:
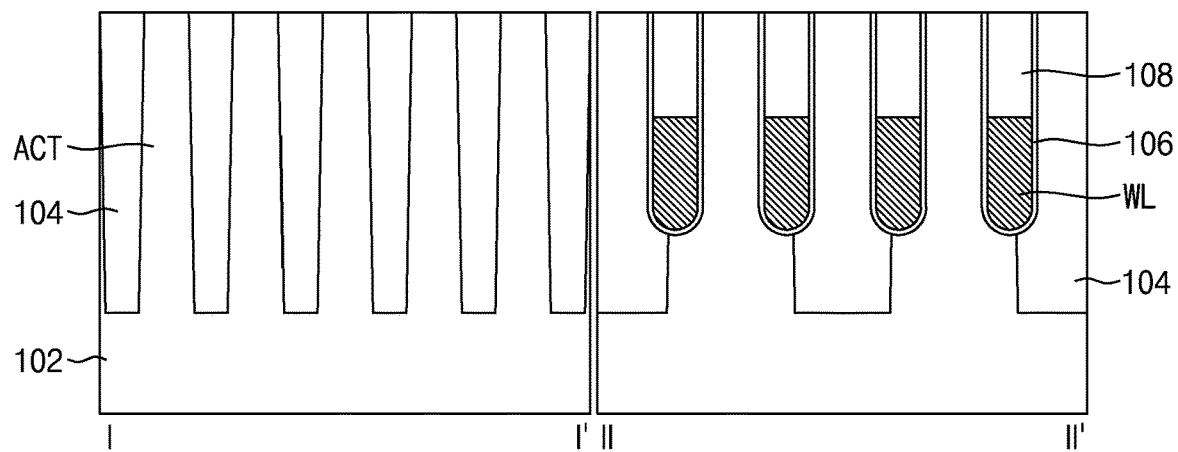

Referring to FIGS. 8A and 8B, a device isolation layer 104 may be formed in an upper portion of a substrate 102. The device isolation layer 104 may define active regions ACT. Each of the active regions ACT may have a bar shape extending in one direction and may include an impurity region. In an example embodiment, the device isolation layer 104 may include silicon oxide.

A word line WL may be disposed in the substrate 102. For example, the word line WL may be formed inside a trench disposed in an upper portion of the substrate 102. The word line WL may fill a portion of the trench. A gate insulating layer 106 may be disposed on an inner wall of the trench. The word lines WL may extend in a first direction D1 and may be disposed to be spaced apart from each other in a second direction D2, e.g., perpendicular to the first direction D1. Two adjacent word lines WL may be disposed to intersect/across each of the active regions ACT. For example, word lines WL may intersect active regions ACT in a plan view. The word line WL may include a conductive material, for example, doped polysilicon, a metal material, such as tungsten, or a metal silicide.

A gate capping layer 108 may be disposed on the word line WL. The gate capping layer 108 may completely fill the remaining space of the trench. The gate capping layer 108 may include silicon nitride, silicon oxynitride, or a combination thereof. The gate insulating layer 106 may surround the word line WL and the gate capping layer 108. The gate insulating layer 106 may include a dielectric material such as silicon oxide or the like.

Figure 9A:
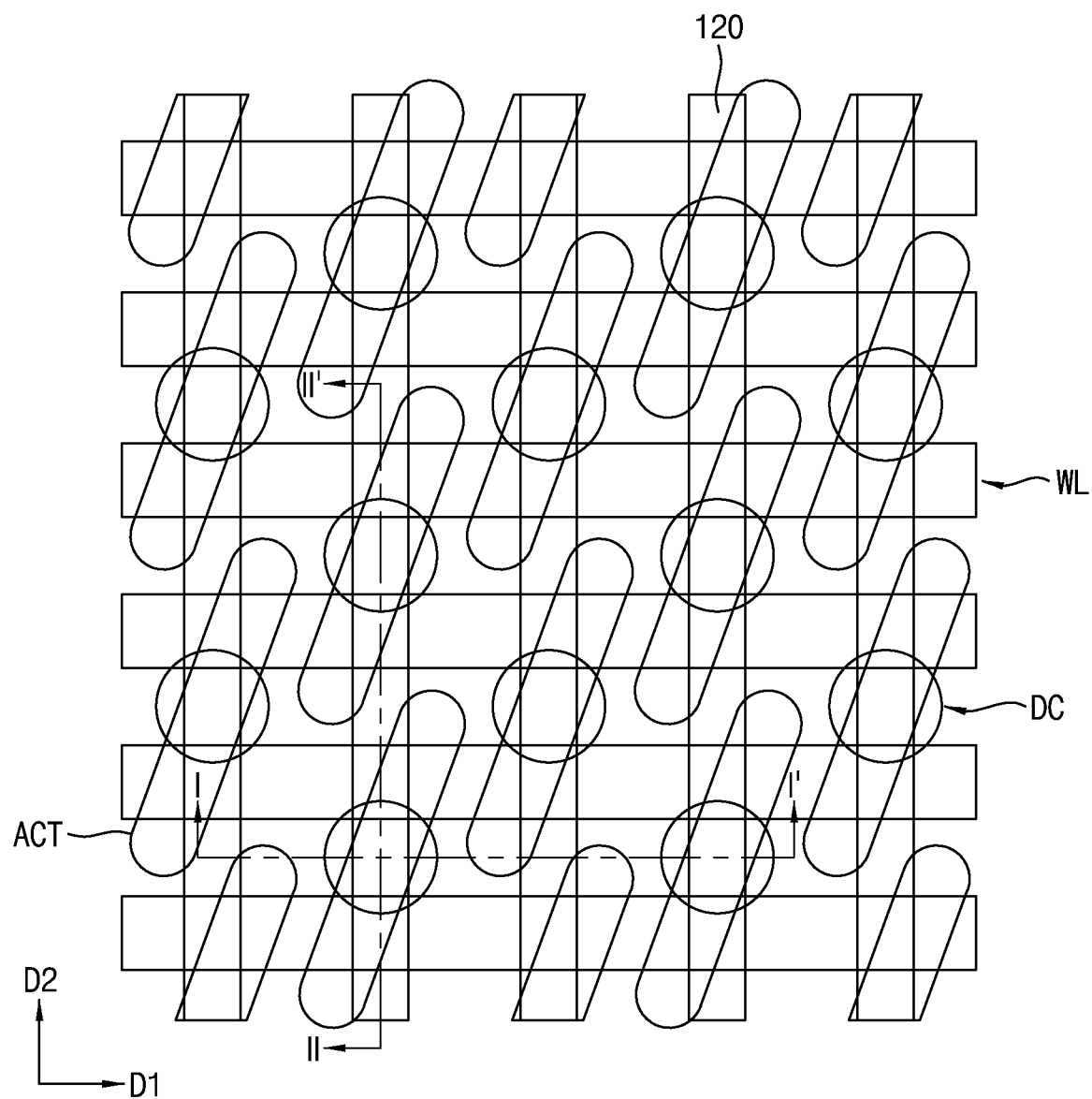
Figure 9B:
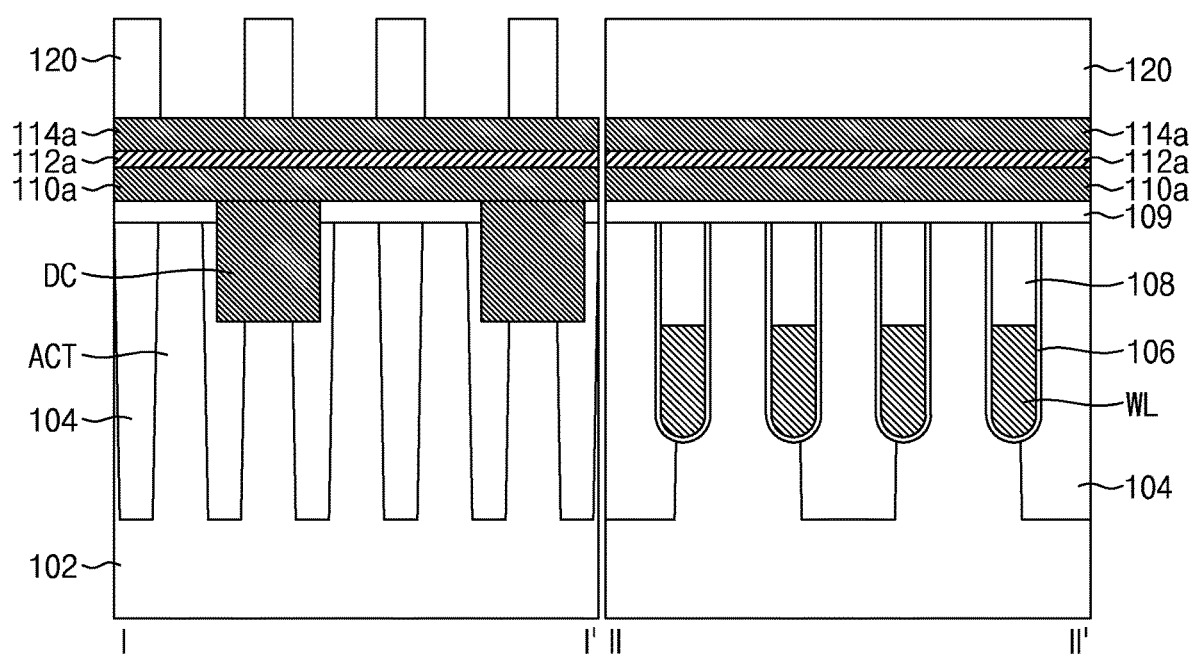

Referring to FIGS. 9A and 9B, a buffer layer 109 may be disposed on the substrate 102. The buffer layer 109 may include silicon oxide, silicon nitride, silicon oxynitride, or a combination thereof and may be formed as a single layer or a multilayered structure. An etching process for patterning a portion of the buffer layer 109 may be performed. For example, the etching process may be performed along a central portion of an active region ACT. The buffer layer 109 and an upper portion of the substrate 102 may be partially removed by the etching process.

A bit line node contact DC may be formed in a space in which the substrate 102 is partially removed. The bit line node contact DC may completely fill the space in which the substrate 102 is partially removed, and may be planarized. For example, the top surface of the bit line node contact DC and the top surface of the buffer layer 109 may be at the same level. The bit line node contact DC may include doped polysilicon, a metal, or a metal silicide.

A first conductive layer 110a, a second conductive layer 112a, and a third conductive layer 114a may be formed on the buffer layer 109 and the bit line node contact DC. The first conductive layer 110a, the second conductive layer 112a, and the third conductive layer 114a may be sequentially stacked. The first conductive layer 110a may include doped polysilicon. The second conductive layer 112a may include a silicide, such as cobalt silicide or titanium silicide, or a nitride such as aluminum titanium nitride. The third conductive layer 114a may include any one of tungsten, aluminum, copper, nickel, and cobalt.

A capping pattern 120 may be formed on the third conductive layer 114a. Capping patterns 120 may be disposed to be spaced apart from each other and may extend in the second direction D2. For example, the capping patterns 120 may be disposed on the bit line node contacts DC to intersect/overlap the bit line node contacts DC, e.g., in a plan view.

Figure 10A:
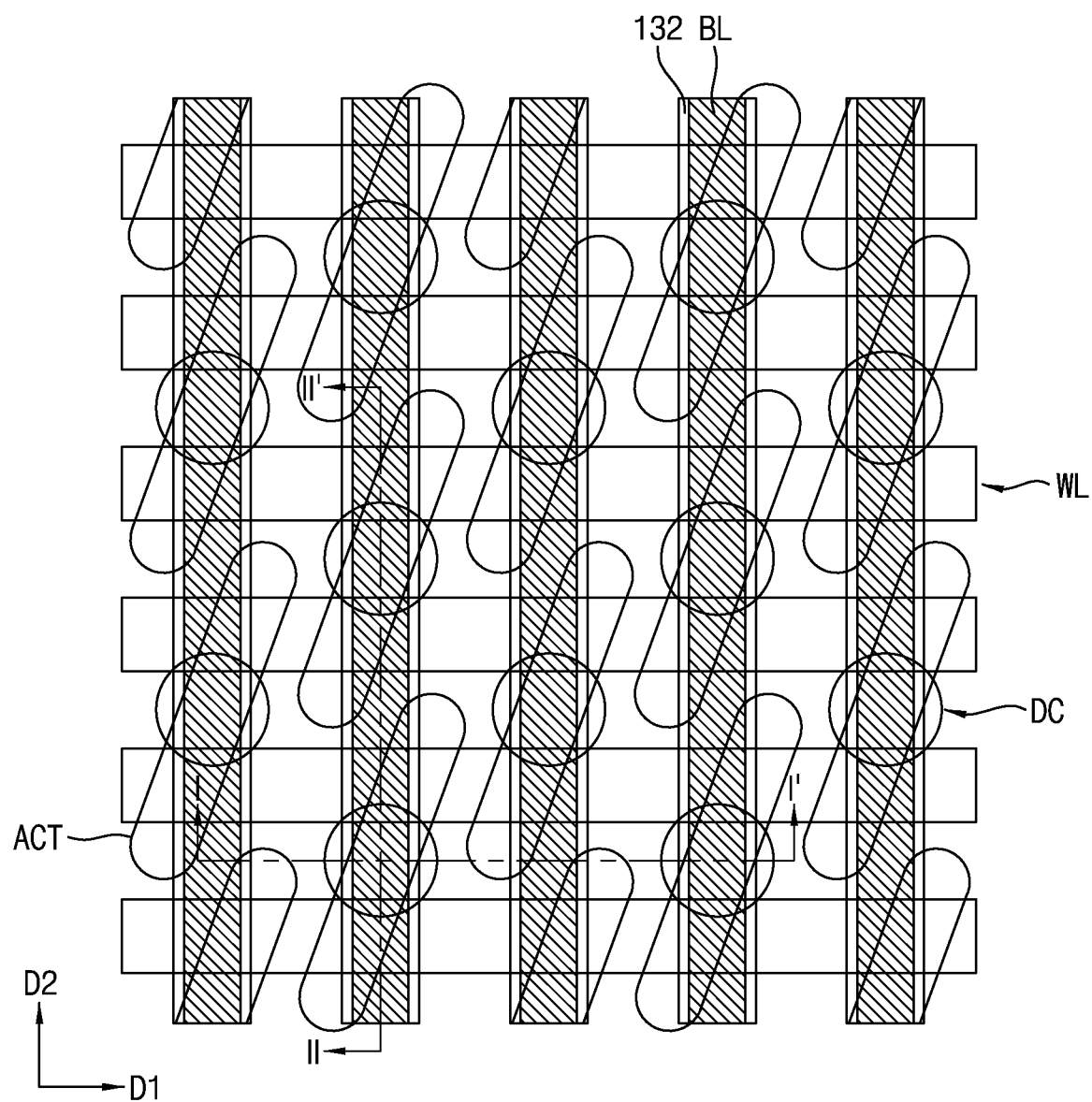
Figure 10B:
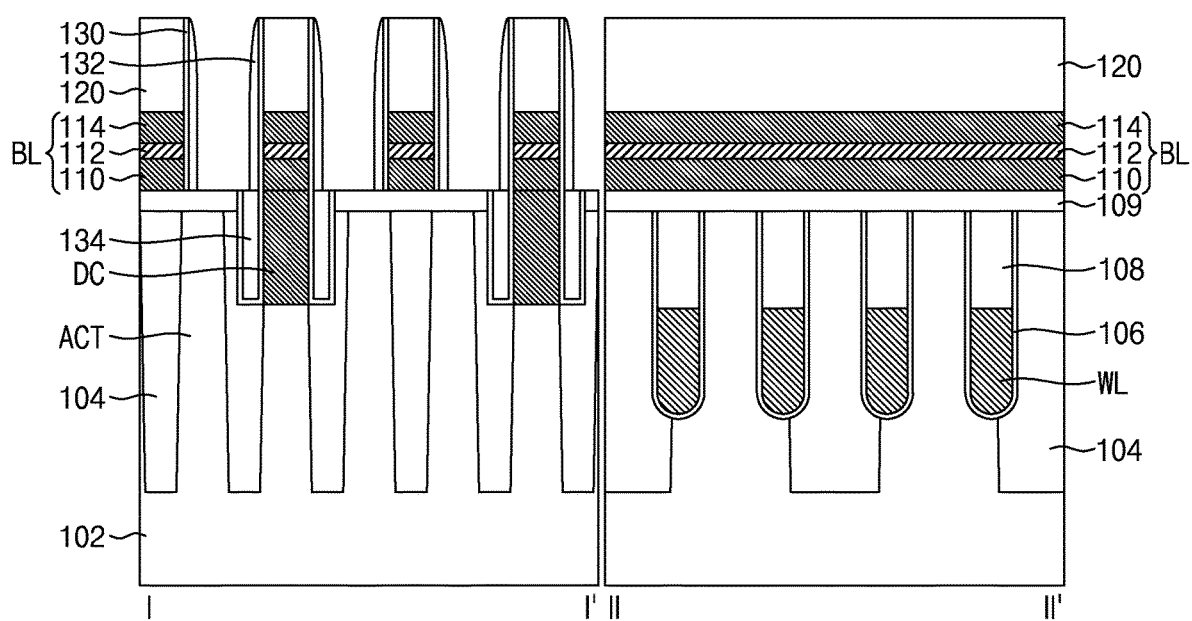

Referring to FIGS. 10A and 10B, the first conductive layer 110a, the second conductive layer 112a, and the third conductive layer 114a may be etched using the capping patterns 120 as an etch mask. For example, the first conductive layer 110a, the second conductive layer 112a, and the third conductive layer 114a may be etched to form a bit line BL extending in the second direction D2. The bit line BL may include a first conductive pattern 110, a second conductive pattern 112, and a third conductive pattern 114, which are sequentially stacked. The bit line BL may extend in the second direction D2 and may intersect/overlap a plurality of bit line node contacts DC, e.g., in a plan view. The bit line node contact DC may be partially removed during the formation of the bit line BL.

First spacers 130 may be formed on side surfaces of the bit line BL. Second spacers 132 may be formed on the first spacers 130. For example, the first spacers 130 and the second spacers 132 may conformally cover side surfaces of the capping pattern 120, the first conductive pattern 110, the second conductive pattern 112, and the third conductive pattern 114. In certain embodiments, the first spacers 130 may also be formed on side surfaces of the bit line node contact DC. Third spacers 134 may be formed in the substrate 102 and may fill spaces in which the bit line node contact DC is partially removed. The third spacers 134 may be surrounded by the first spacers 130, e.g., in a cross-sectional view. When viewed from above, e.g., in a plan view, the first spacers 130, the second spacers 132, and the third spacers 134 may extend in the second direction D2 on both sides of the bit line BL.

The first spacers 130 and the second spacers 132 may include a single layer or a multilayered structure and may include silicon oxide, silicon nitride, or silicon oxynitride. For example, each of the first spacers 130 and the second spacers 132 may include plural layers in certain embodiments. The third spacers 134 may include a material having an etch selectivity with respect to the buffer layer 109 and may include, for example, silicon oxide, silicon nitride, or silicon oxynitride.

Figure 11A:
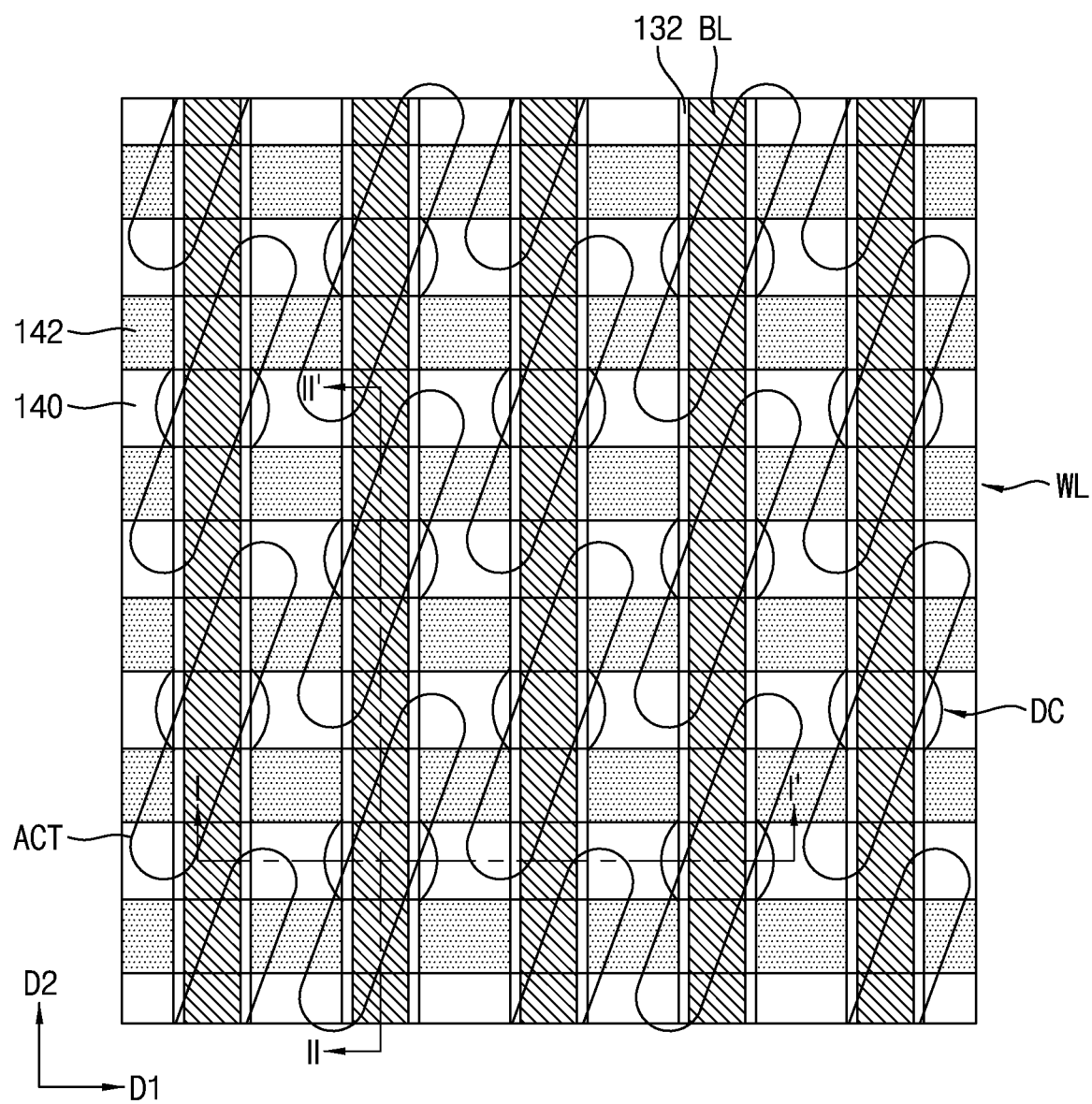
Figure 11B:
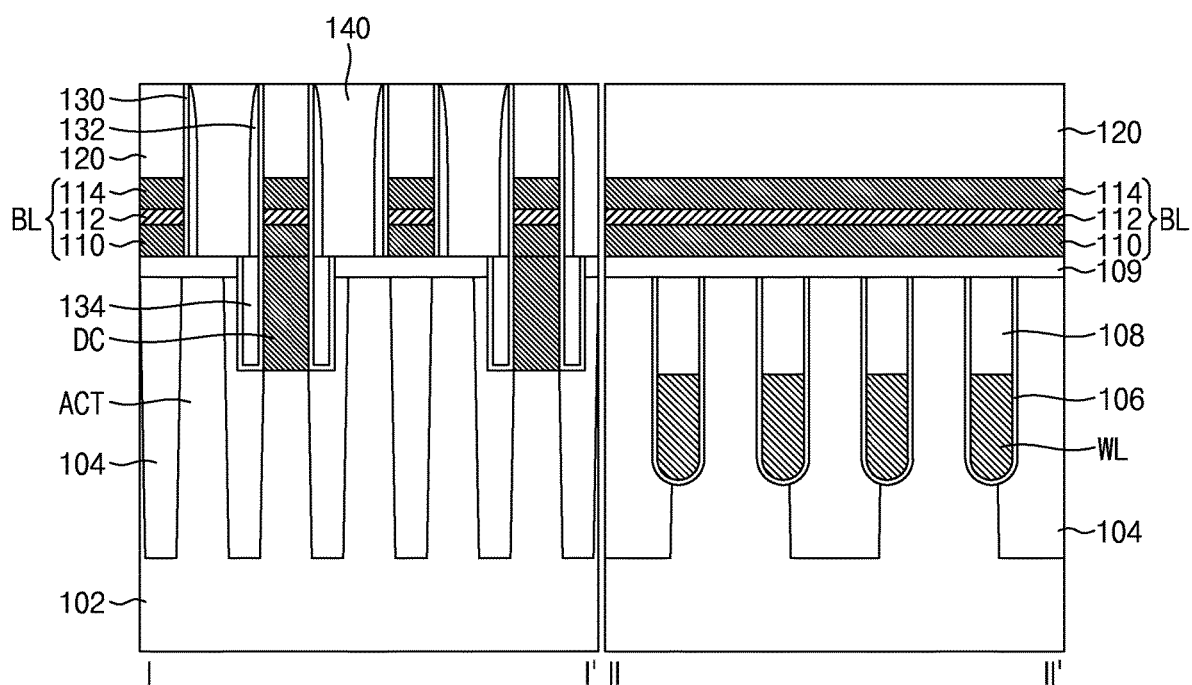

Referring to FIGS. 11A and 11B, a sacrificial pattern 140 and an isolated pattern 142 may be formed in a space between the bit lines BL. For example, the sacrificial pattern 140 may be disposed between the word lines WL, e.g., in a plan view, in the space between the bit lines BL. The formation of the sacrificial pattern 140 may include filling the space between the bit lines BL with an insulating material and performing a patterning process. An upper surface of the sacrificial pattern 140 may be disposed at the same level as an upper surface (e.g., of an adjacent/closest portion) of the capping pattern 120. The sacrificial pattern 140 may include silicon oxide, silicon nitride, silicon oxynitride, or a combination thereof.

The isolated pattern 142 may be disposed in a space between two points at which the bit lines BL crosses the word line WL, e.g., in a plan view. The isolated pattern 142 may be formed at a point at which the sacrificial pattern 140 is partially removed. The sacrificial pattern 140 and the isolated pattern 142 may be alternately disposed in the second direction D2. Although not shown, an upper surface of the isolated pattern 142 may be disposed at the same level as the upper surface (e.g., of an adjacent/closest portion) of the capping pattern 120. The isolated pattern 142 may include silicon nitride, silicon oxynitride, silicon carbonitride, or a combination thereof.

Figure 12A:
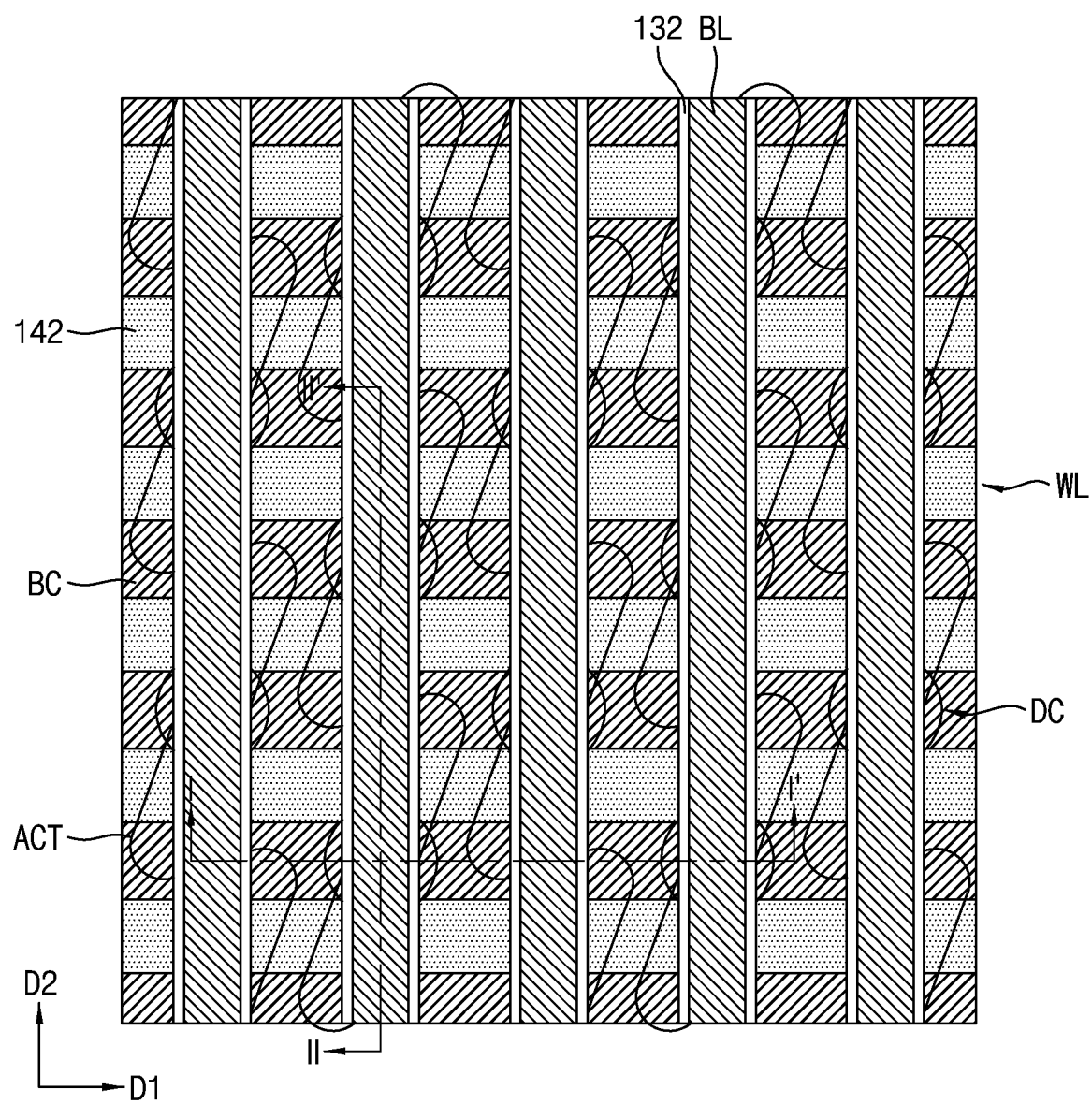
Figure 12B:
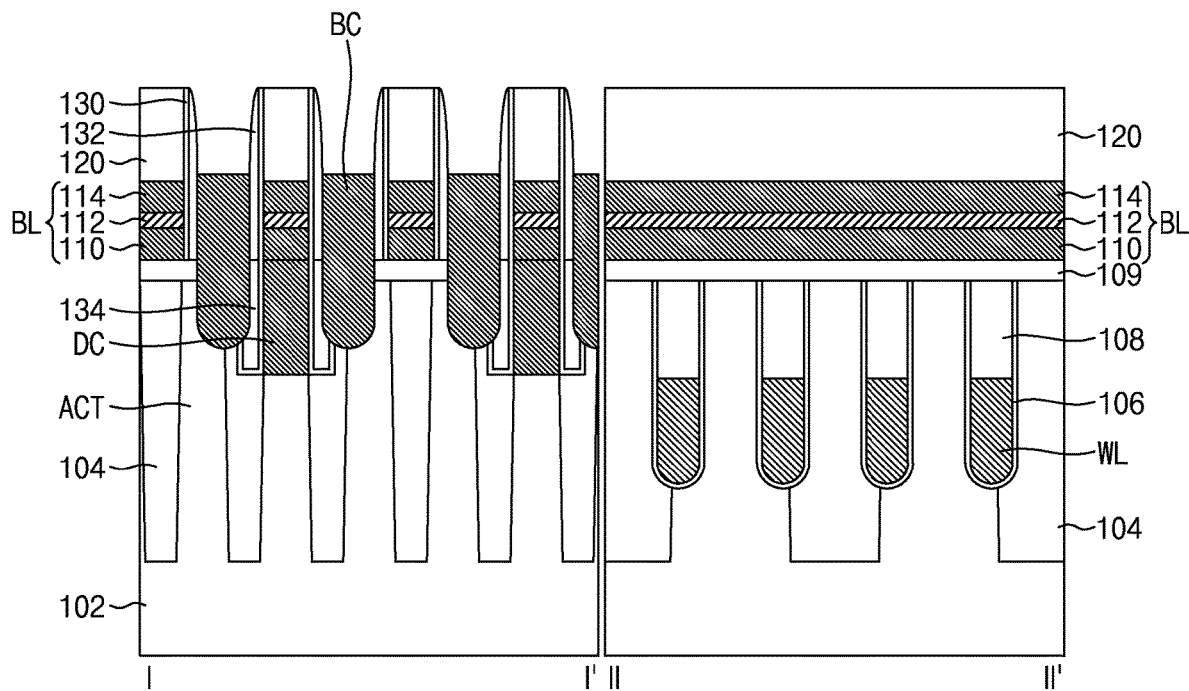

Referring to FIGS. 12A and 12B, the sacrificial pattern 140 may be selectively removed. Thereafter, the buffer layer 109 and an upper portion of the substrate 102 may be partially removed using an anisotropic etching process. For example, the buffer layer 109 and the upper portion of the substrate 102 disposed under the sacrificial pattern 140 may be removed after removing the sacrificial pattern 140 from the substrate 102. The first spacers 130 and the third spacers 134 may be removed from the side surfaces of the bit line node contact DC using the etching process. For example, portions of the first spacers 130 and the third spacers 134 disposed on the side surfaces of the bit line node contact DC may be removed by the etching process. A trench may be formed by the etching process, and the trench may expose the active region ACT, e.g., a portion of the active region ACT.

The trench may be filled with a conductive material. For example, the conductive material may be formed in the trench and on the capping pattern 120. The conductive material may be planarized to expose the upper surface of the capping pattern 120. Then, the conductive material may be etched back to form a storage node contact BC. An upper surface of the storage node contact BC may be disposed at a lower level than the upper surface (e.g., of an adjacent/closest portion) of the capping pattern 120. The storage node contact BC may include a metal such as doped polysilicon, tungsten, titanium, a metal nitride such as titanium nitride, or a combination thereof.

Figure 13:
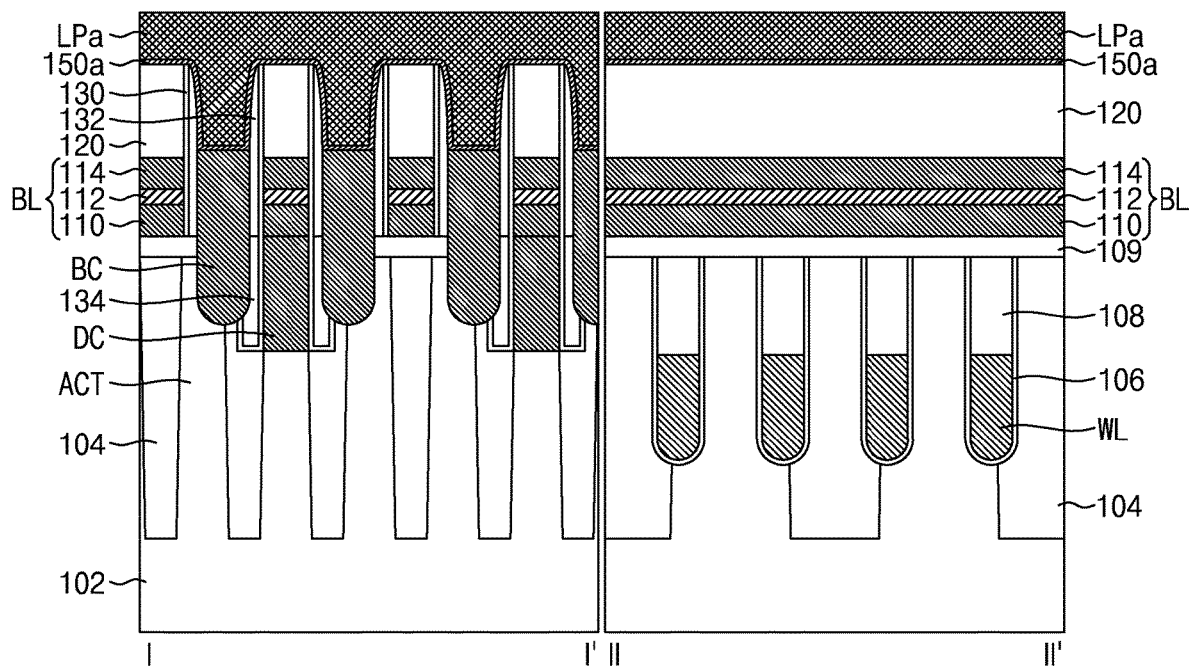

Referring to FIG. 13, a barrier layer 150*a* and a landing pad material layer LPa may be sequentially formed on the resultant structure of FIGS. 12A and 12B. For example, the barrier layer 150*a* may be conformally formed on the capping pattern 120, the second spacers 132, and the storage node contact BC. The landing pad material layer LPa may be formed on the barrier layer 150*a*. The barrier layer 150*a* may include TiN, Ti/TiN, TiSiN, TaN, or WN. The landing pad material layer LPa may include tungsten.

Figure 14A:
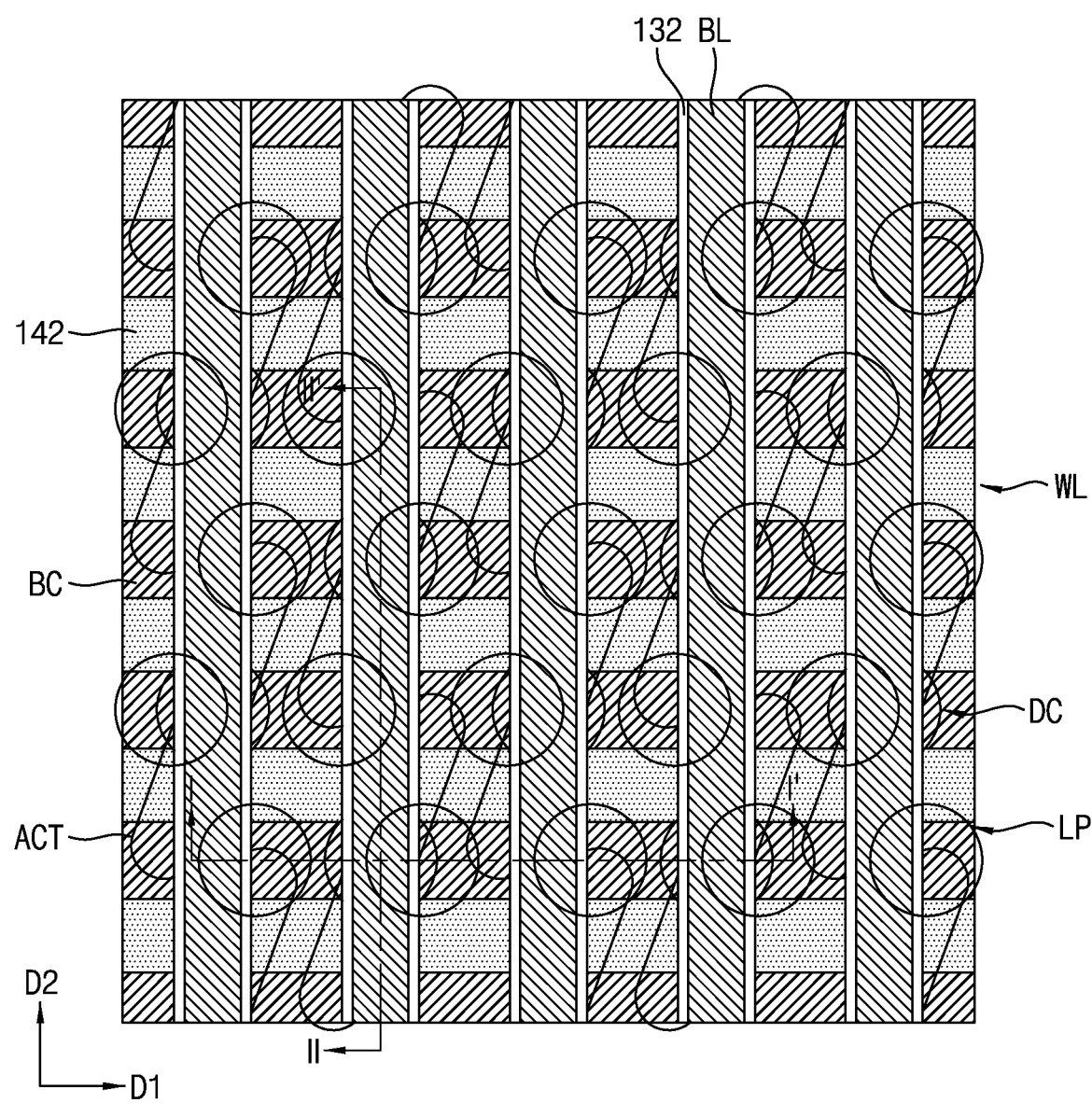
Figure 14B:
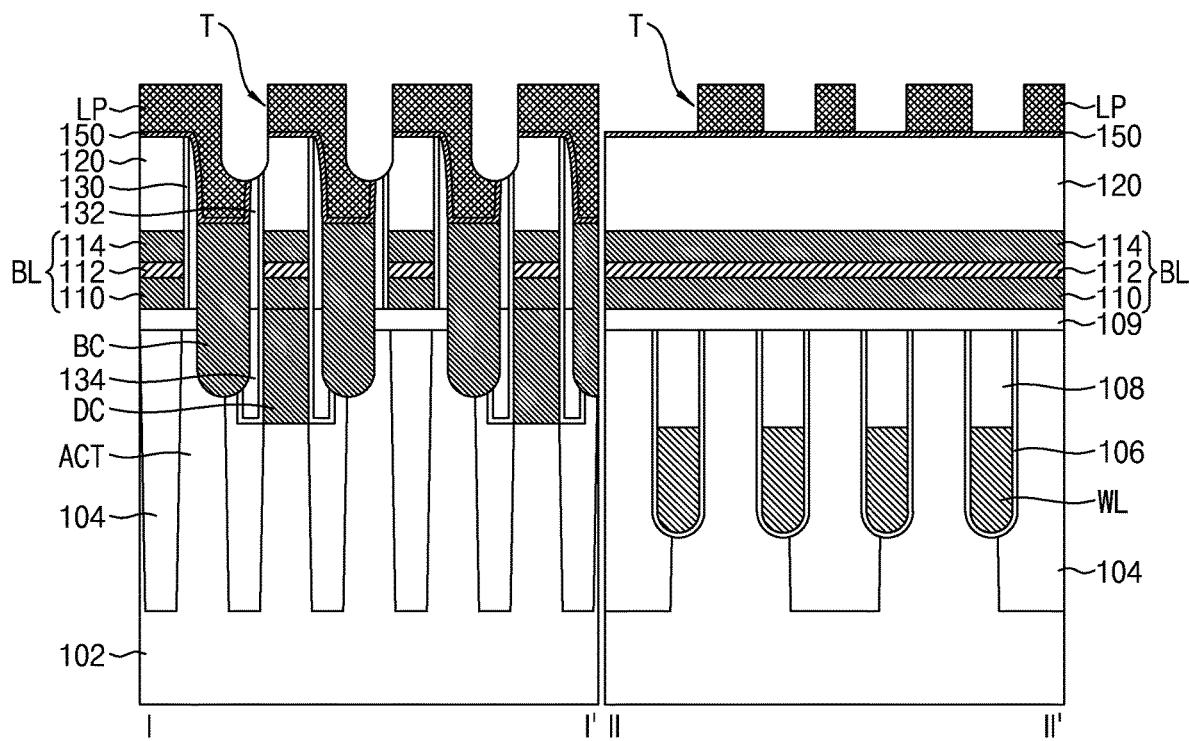

Referring to FIGS. 14A and 14B, the barrier layer 150*a* and the landing pad material layer LPa may be patterned. A landing pad LP may be formed by patterning the landing pad material layer LPa. A trench T may be formed/disposed between the landing pads LP. A lower end of the trench T may be formed/disposed at a lower level than the upper surface (e.g., of an adjacent/closest portion) of the capping pattern 120. A portion of the barrier layer 150*a* may be removed by forming the trench T to form a barrier pattern 150. The capping pattern 120, the first spacers 130, and the second spacers 132 may be partially exposed by/through the trench T. Side surfaces and a lower surface of the trench T may be rounded.

Figure 15:
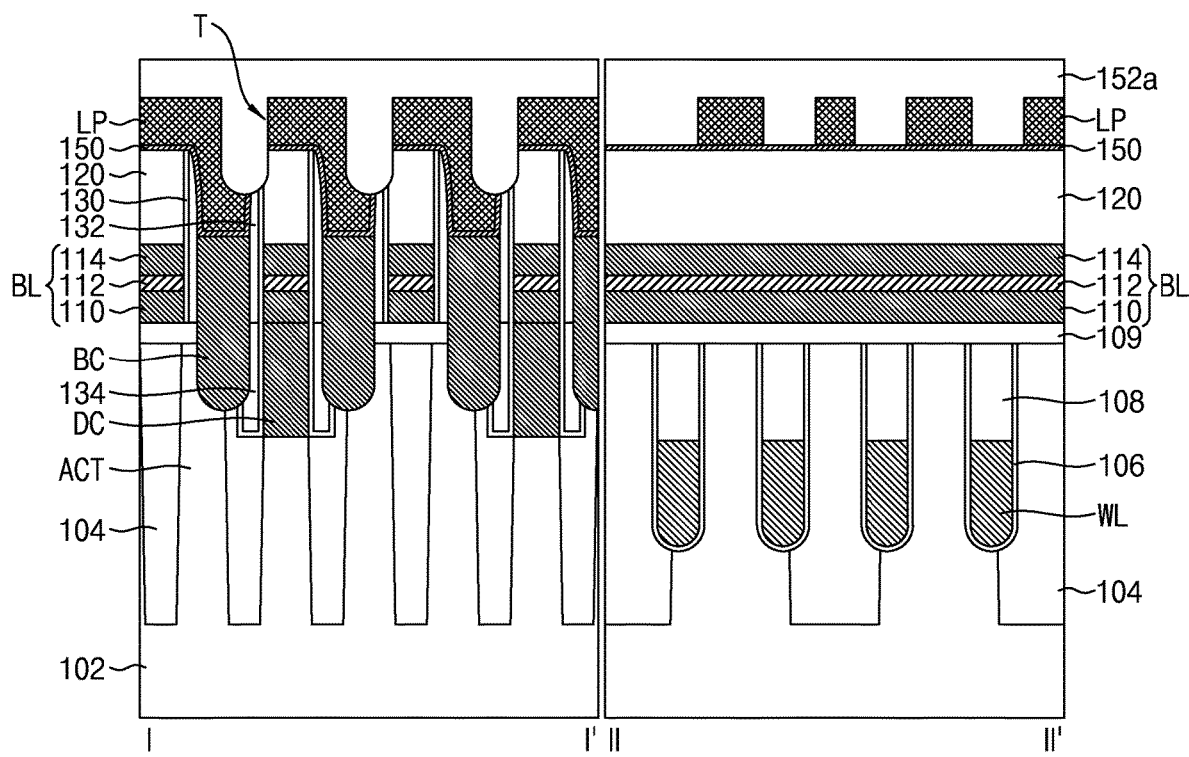

Referring to FIG. 15, a first insulating layer 152*a* may be formed on the barrier pattern 150 and the landing pad LP. The first insulating layer 152*a* may fill the inside of the trench T and may cover the barrier pattern 150 and the landing pad LP. In an example embodiment, a process of planarizing an upper portion of the first insulating layer 152*a* may be performed, but the inventive concept is not limited thereto. In an example embodiment, the first insulating layer 152*a* may include silicon nitride.

Figure 16:
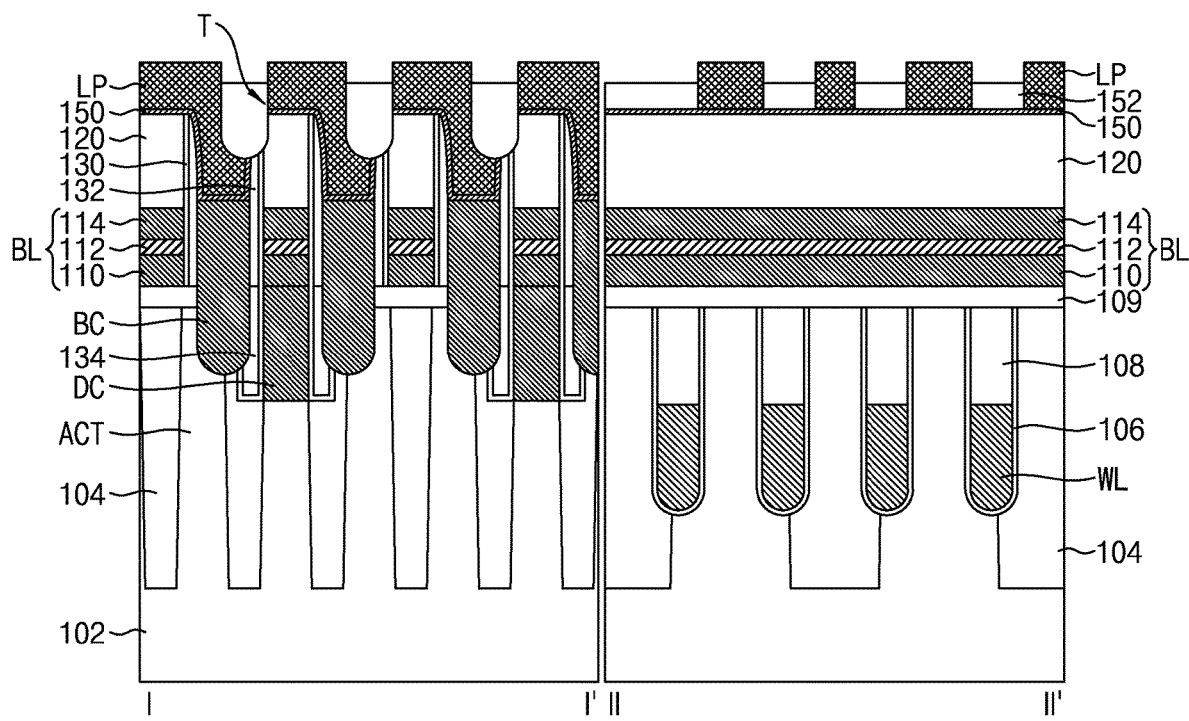

Referring to FIG. 16, the first insulating layer 152*a* may be partially etched to form a first insulating pattern 152. For example, the first insulating layer 152*a* may be selectively etched using an etchback process. The first insulating pattern 152 may be disposed inside the trench T and cover at least a portion of a side surface of the landing pad LP. In an example embodiment, an upper surface of the first insulating pattern 152 may be disposed at a lower level than an upper surface (e.g., of an adjacent/closest portion) of the landing pad LP. In an example, the landing pad LP may include a region that protrudes from the upper surface of the first insulating pattern 152. Portions of the upper surface and the side surface of the landing pad LP may be exposed.

Figure 17:
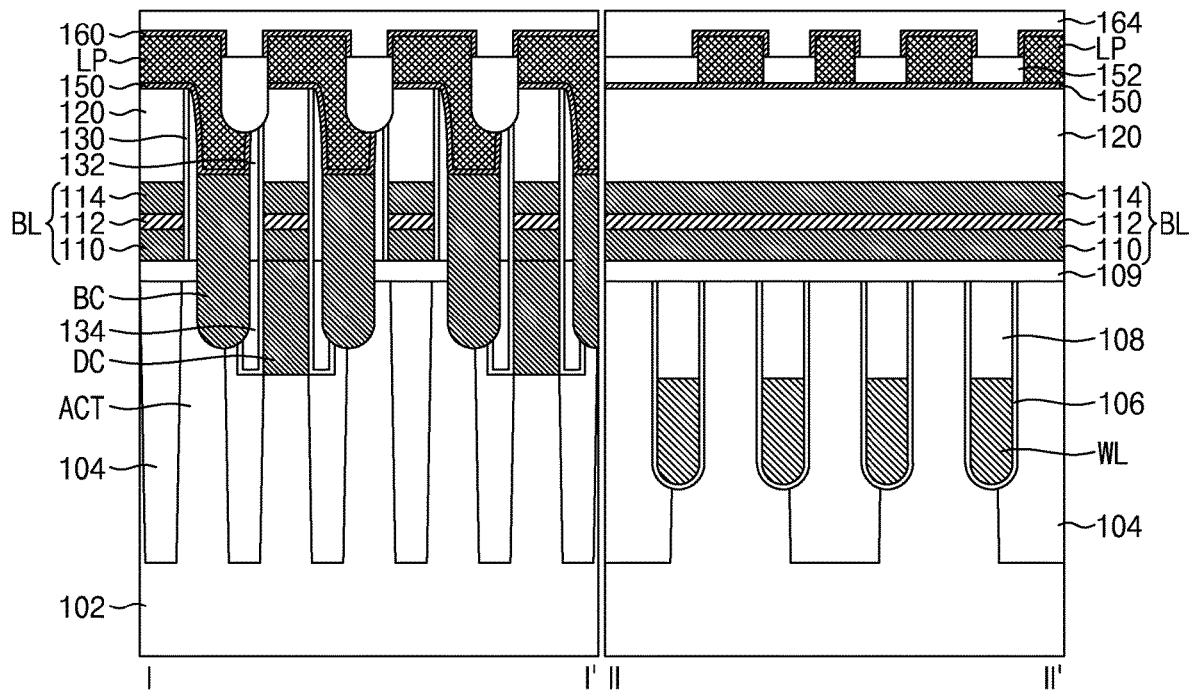

Referring to FIG. 17, a pad oxide layer 160 may be formed on the landing pad LP. For example, the pad oxide layer 160 may be formed along the surface of the landing pad LP. The pad oxide layer 160 may be formed by oxidizing the landing pad LP. In an example embodiment, the pad oxide layer 160 may include tungsten oxide. The first insulating pattern 152 may not be oxidized during the oxidation process by which the landing pad LP is oxidized. Accordingly, the pad oxide layer 160 may not be formed on the first insulating pattern 152. A second insulating layer 164*a* may be formed on the first insulating pattern 152 and the pad oxide layer 160. In an example embodiment, second insulating layer 164*a* may include silicon nitride, silicon oxynitride, or a combination thereof.

Although FIG. 17 illustrates a case in which, during the oxidation process, the landing pad LP is not changed and the pad oxide layer 160 is formed on the landing pad LP, the inventive concept is not limited thereto. For example, referring to FIG. 6, a portion of a surface of the landing pad LP may change into the pad oxide layer 160 during the oxidation process. Since a portion of the landing pad LP blocked by the first insulating pattern 152 is not oxidized, a step (e.g., a step/offset structure) may be formed in the side surface of the landing pad LP. Alternatively, the landing pad LP may have a bottleneck structure in which a lateral width of the landing pad LP is sharply reduced near the upper surface of the first insulating pattern 152.

FIGS. 18 to 22 are views illustrating steps of a process and/or a sequence of a method of manufacturing a semiconductor device according to an example embodiment. FIGS. 18 to 22 are partial enlarged views of the semiconductor device. The remaining components which are not shown may be the same as those shown in the cross-sectional view of FIG. 17.

Figure 18:
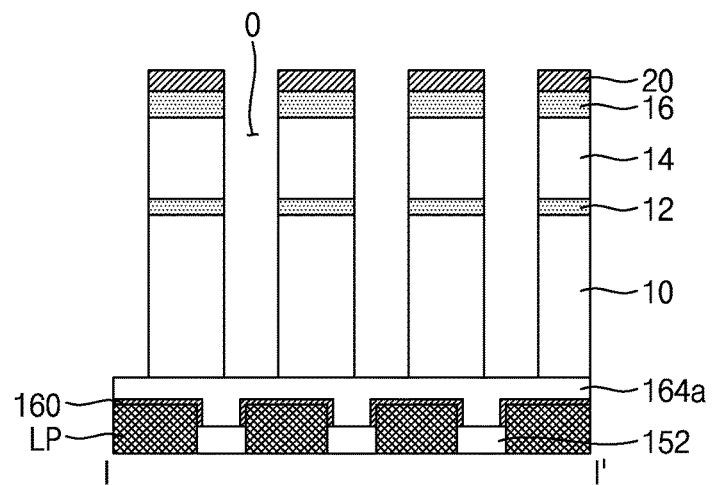

Referring to FIG. 18, a first mold layer 10, a first support layer 12, a second mold layer 14, and a second support layer 16 may be sequentially stacked on the resultant structure of FIG. 17. A mask pattern 20 may be disposed on the second support layer 16.

The first mold layer 10 and the second mold layer 14 may include a material having an etch selectivity with respect to the first support layer 12 and the second support layer 16. For example, the first mold layer 10 and the second mold layer 14 may include silicon oxide, and the first support layer 12 and the second support layer 16 may include silicon nitride. The mask pattern 20 may expose a portion of the second support layer 16. The mask pattern 20 may define a region in which a structure of a lower electrode 30 is disposed. The mask pattern 20 may include amorphous carbon or polysilicon.

An etching process may be performed to form an opening O along the mask pattern 20. The opening O may be formed to pass through the first mold layer 10, the first support layer 12, the second mold layer 14, and the second support layer 16. The opening O may expose the second insulating layer 164a. The opening O may be formed using a dry etching process. For example, the second support layer 16, the second mold layer 14, the first support layer 12, and the first mold layer 10 may be sequentially anisotropically etched, e.g., by a dry etching process.

Figure 19:
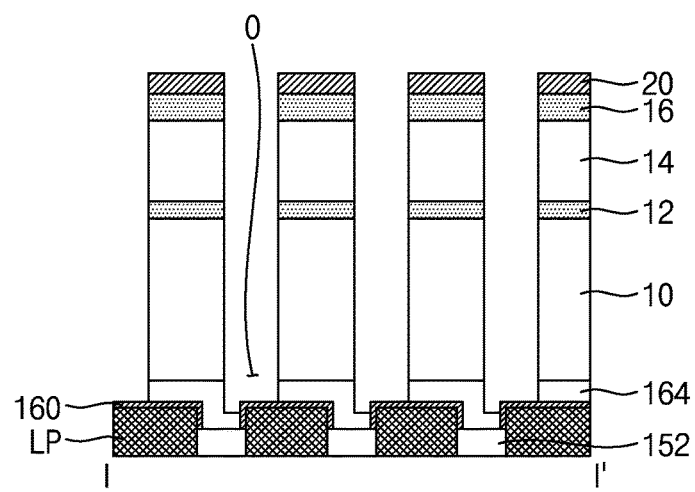

Referring to FIG. 19, the second insulating layer 164a may be partially etched to form a second insulating pattern 164. The second insulating layer 164a may be anisotropically etched along the opening O, and a pad oxide layer 160 may be used as an etch stop layer. The opening O may extend downward and expose the pad oxide layer 160 by the etching process. A landing pad LP and a first insulating pattern 152 may not be exposed to the opening O. Although FIG. 18 illustrates a case in which a lower surface of the opening O is formed parallel to an upper surface of the landing pad LP, the inventive concept is not limited thereto. For example, referring to FIG. 4, the second insulating layer 164a may be over-etched so that the lower surface of the opening O may be rounded. The lower electrode formed inside the opening O may be rounded, e.g., when the opening O has a round bottom surface.

The opening O may be misaligned with the landing pad LP. For example, a vertical axis of the opening O passing through a center of the opening O and a vertical axis of the landing pad LP passing through a center of the landing pad LP may be disposed to be spaced apart from each other in a lateral direction in a cross-sectional view. A lower end of the opening O may be disposed at a lower level than the upper surface of the landing pad LP. Accordingly, portions of an upper surface and a side surface of the pad oxide layer 160 may be exposed. As non-limiting example embodiments, when levels of layers/patterns are compared in this disclosure, the levels may be compared with adjacent/closest and/or electrically/logically corresponding layers/patterns. Also, the levels describe vertical levels with respect to a surface of the substrate, unless explicitly indicated as otherwise.

Figure 20:
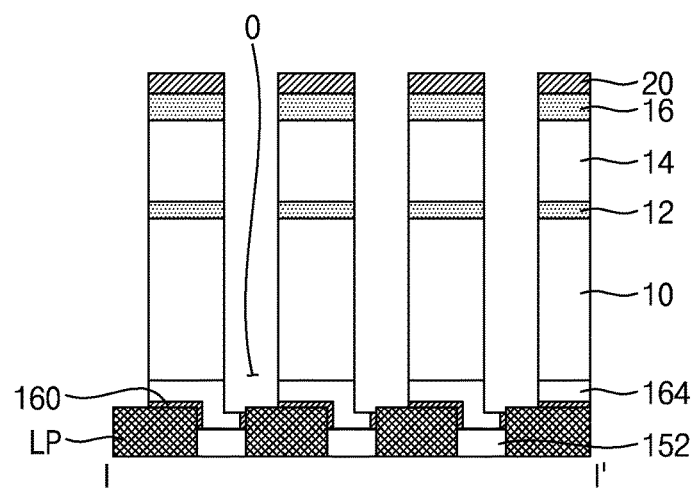

Referring to FIG. 20, the pad oxide layer 160 may be partially removed using an etching process. The etching process may be a wet etching process that is performed using an alkali solution (e.g., NH$_4$OH or the like) as an etchant. The etchant may selectively etch the pad oxide layer 160, and the first insulating pattern 152, the second insulating pattern 164, and the landing pad LP may not be etched.

A portion of the landing pad LP may be exposed due to the etching process. In an example embodiment, portions of an upper surface and a side surface of the landing pad LP may be exposed. Although FIG. 19 illustrates a case in which a portion of the pad oxide layer 160 remains on the side surface of the landing pad LP, the inventive concept is not limited thereto. In another example embodiment, the pad oxide layer 160 disposed on the side surface of the landing pad LP may be removed to expose the first insulating pattern 152.

Although FIG. 20 illustrates a case in which a cross-section of the etched pad oxide layer 160 is disposed coplanar with a cross-section of the second insulating pattern 164, e.g., in a vertical direction, the inventive concept is not limited thereto. In another example embodiment, the pad oxide layer 160, which is removed due to the wet etching process, may be over-etched and have a concave cross-section, e.g., in a lateral direction. For example, referring to FIG. 5, a lateral portion 161 and a vertical portion 162 of the pad oxide layer 160 may be formed to have concave cross-sections. A lateral protrusion 32 of the lower electrode 30b may have a convex shape toward the pad oxide layer 160 in a lateral direction. A vertical protrusion 34 of the lower electrode 30b may have a convex shape toward the first insulating pattern 152 in a vertical direction. The lateral protrusion 32 and the vertical protrusion 34 may increase a contact area between the lower electrode 30b and the landing pad LP and may reduce a resistance of a capacitor CAP due to a misalignment, e.g., between the landing pad LP and the lower electrode 30.

Figure 21:
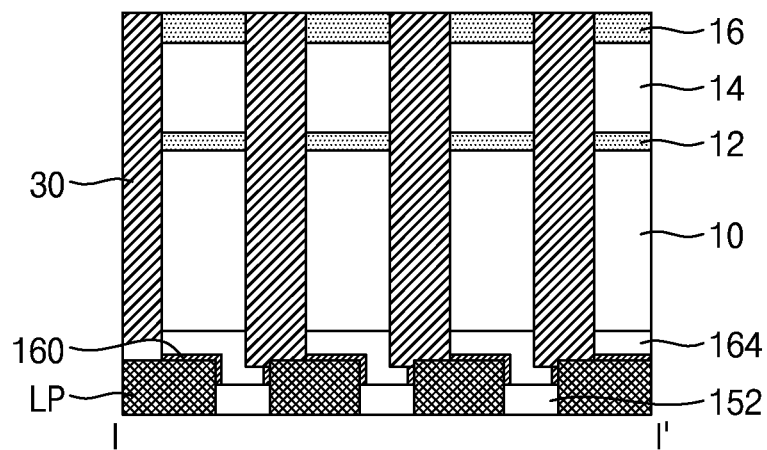

Referring to FIG. 21, the lower electrode 30 may be formed to fill an inside of the opening O. The lower electrode 30 may be formed using a process such as a chemical vapor deposition (CVD) process, an atomic layer deposition (ALD) process, a plasma-enhanced CVD (PECVD) process, a plasma enhanced ALD (PEALD) process, or the like. For example, the lower electrode 30 may be formed of a conductive layer. In an example embodiment, the conductive layer may be deposited using an ALD process. The formation of the lower electrode 30 may include forming a conductive material inside the opening O and performing a planarization process. The lower electrode 30 may pass through the second insulating pattern 164 and come into contact with the landing pad LP and the pad oxide layer 160. In an example embodiment, the lower electrode 30 may be in contact with at least portions of the upper surface and the side surface of the landing pad LP. In an example embodiment, the lower electrode 30 may have a pillar shape. In another example embodiment, the lower electrode 30 may have a cylindrical shape. The lower electrode 30 may include niobium oxide (NbO), a metal, such as titanium (Ti), tungsten (W), nickel (Ni), or cobalt (Co), or a metal nitride such as titanium nitride (TiN), titanium silicon nitride (TiSiN), titanium aluminum nitride (TiAlN), tantalum nitride (TaN), tantalum silicon nitride (TaSiN), tungsten nitride (WN), niobium nitride (NbN), or the like.

Figure 22:
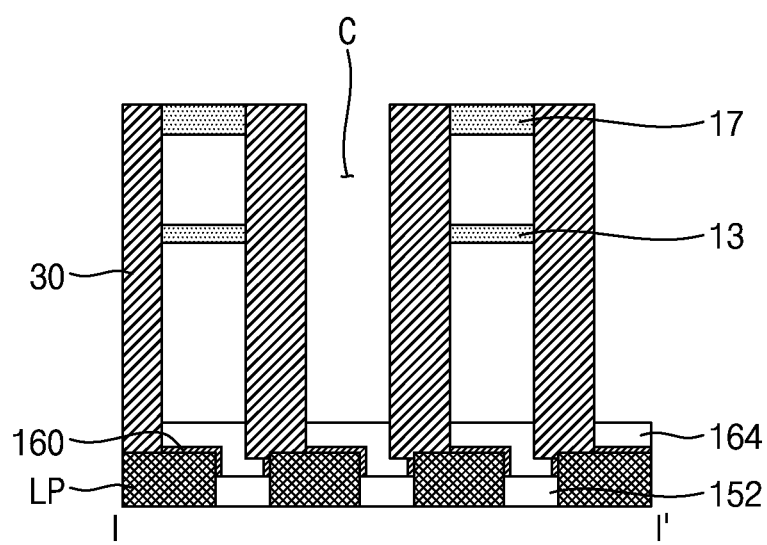

Referring to FIG. 22, the second support layer 16 may be partially etched to form a second supporter pattern 17. A portion of the second mold layer 14 may be exposed by forming the second supporter pattern 17. For example, a photolithography process may be performed to partially remove the second support layer to form the second supporter pattern 17 and to expose the second mold layer 14. The second mold layer 14 may be entirely removed using a wet etching process. For example, an etchant may flow between the second supporter patterns 17 and/or between the lower electrodes 30, and may remove the second mold layer 14. During the process of etching the second mold layer 14, the lower electrodes 30, the first support layer 12, and the second support layer 16, which have an etch selectivity with respect to the second mold layer 14, may not be removed.

The first support layer 12 exposed by removing the second mold layer 14 may be partially etched to form the first supporter pattern 13. For example, a photolithography process may be performed to partially remove the first support layer 12 so that to form the first support pattern 13. The first mold layer 10 exposed by the first supporter pattern 13 may be entirely removed using a wet etching process. The first mold layer 10 and the second mold layer 14 may be removed to form a cavity C between the lower electrodes 30. For example, the cavity C may be formed between the first supporter pattern 13 and the second supporter pattern 17 and between the first supporter pattern 13 and the second insulating pattern 164. The first supporter pattern 13 and the second supporter pattern 17 may connect the lower electrodes 30 to each other and support the lower electrodes 30 so that the lower electrodes 30 may not collapse.

Referring back to FIG. 2, a capacitor dielectric layer 40 and an upper electrode 50 may be formed on the resultant structure of FIG. 22. The capacitor dielectric layer 40 may be conformally formed along surfaces of the second insulating pattern 164, the lower electrode 30, the first supporter pattern 13, and the second supporter pattern 17.

The capacitor dielectric layer 40 may include a metal oxide such as hafnium oxide ($HfO_2$), zirconium oxide ($ZrO_2$), hafnium zirconium oxide (HfZrO), aluminum oxide ($Al_2O_3$), lanthanum oxide ($La_2O_3$), tantalum oxide ($Ta_2O_5$), or titanium oxide ($TiO_2$), a perovskite-type dielectric material such as strontium titanate ($SrTiO_3$ (STO)), barium titanate ($BaTiO_3$), lead zirconate titanate (PZT), or lead lanthanum zirconate titanate (PLZT), or a combination thereof. The capacitor dielectric layer 40 may be formed using a process such as a CVD process, an ALD process, or the like. An upper electrode 50 may be formed to cover the capacitor dielectric layer 40. The upper electrode 50 may entirely fill a space between the lower electrodes 30 and a space between the first supporter pattern 13 and the second supporter pattern 17. The upper electrode 50 may include the same material as the lower electrode 30.

According to the example embodiments of the inventive concept, a lower electrode may be in contact with a side surface and an upper surface of a landing pad to obtain a large contact area between the lower electrode and the landing pad. Thus, a resistance of the lower electrode may be reduced.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A semiconductor device comprising:
   a landing pad including a metal;
   a first insulating pattern in contact with a lower portion of a first side surface of the landing pad;
   a metal oxide layer having a lateral portion disposed on a portion of an upper surface of the landing pad and a first vertical portion in contact with an upper portion of the first side surface of the landing pad;
   a second insulating pattern in contact with an upper surface of the first insulating pattern and covering the first insulating pattern and the metal oxide layer, wherein the first insulating pattern is formed homogeneously throughout the first insulating pattern and the second insulating pattern is formed homogeneously throughout the second insulating pattern; and
   a lower electrode that is disposed in the second insulating pattern and is in contact with a portion of the upper surface of the landing pad and an upper portion of a second side surface of the landing pad, the second side surface opposite to the first side surface,
   wherein the metal that forms the metal oxide layer is the same metal as the metal included the landing pad.

2. The semiconductor device of claim 1, wherein a portion of a lower surface of the lower electrode is disposed at a lower level than the upper surface of the landing pad.

3. The semiconductor device of claim 1, further comprising a third insulating pattern that is in contact with a portion of the second side surface of the landing pad, wherein the metal oxide layer includes a second vertical portion that is disposed between the lower electrode and the third insulating pattern.

4. The semiconductor device of claim 3, wherein an upper surface of the second vertical portion of the metal oxide layer contacts the lower electrode, and
   a lower surface of the second vertical portion of the metal oxide layer contacts the third insulating pattern.

5. The semiconductor device of claim 1, wherein the metal oxide layer includes tungsten oxide.

6. The semiconductor device of claim 1, further comprising:
   a capacitor dielectric layer covering an upper surface of the second insulating pattern and a portion of a side surface of the lower electrode; and
   an upper electrode disposed on the capacitor dielectric layer.

7. The semiconductor device of claim 6, wherein the lower electrode has a cylindrical shape.

8. The semiconductor device of claim 7, wherein an inner lower surface of the lower electrode is disposed at a lower level than the upper surface of the second insulating pattern.

9. The semiconductor device of claim 7, wherein the upper electrode comprises a filling portion with which an inner lower portion of the lower electrode is filled, and
   wherein the filling portion is disposed at a lower level than the upper surface of the second insulating pattern.

10. The semiconductor device of claim 1, wherein an upper surface of the second insulating pattern is disposed at a higher level than a lower surface of the lower electrode.

11. The semiconductor device of claim 1, wherein the upper surface of the first insulating pattern is disposed at a lower level than the upper surface of the landing pad.

12. The semiconductor device of claim 3, wherein the lower electrode includes a vertical protrusion that is in contact with a portion of the second side surface of the landing pad, and
   a lower surface of the vertical protrusion of the lower electrode is lower than the upper surface of the landing pad.

13. The semiconductor device of claim 12, wherein a portion of the metal oxide layer contacts the vertical protrusion of the lower electrode.

14. The semiconductor device of claim 12, wherein a lower end of the vertical protrusion of the lower electrode is in contact with the third insulating pattern.

15. A semiconductor device comprising:
   a substrate;
   a bit line structure disposed on the substrate and including a first side, and a second side that is opposite to the first side with respect to the bit line structure;
   a first storage node contact disposed adjacent to the first side of the bit line structure;
   a second storage node contact disposed adjacent to the second side of the bit line structure;
   a first landing pad disposed on the first storage node contact and including a first upper surface, a first side surface, and a second side surface that is opposite to the first side surface with respect to the first landing pad;
   a second landing pad disposed on the second storage node contact and including a second upper surface, a third side surface, and a fourth side surface that is opposite to the third side surface with respect to the second landing pad;
   a first insulating pattern disposed between the first landing pad and the second landing pad;

a first metal oxide layer including a first lateral portion that is disposed on the first upper surface of the first landing pad, a first vertical portion that is disposed on the first side surface of the first landing pad, and a second vertical portion that is disposed on the second side surface of the first landing pad;

a second metal oxide layer including a second lateral portion that is disposed on the second upper surface of the second landing pad, a third vertical portion that is disposed on the third side surface of the second landing pad, and a fourth vertical portion that is disposed on the fourth side surface of the second landing pad, the second vertical portion of the first metal oxide layer and the third vertical portion of the second metal oxide layer facing each other;

a first lower electrode disposed on the first landing pad;

a second lower electrode disposed on the second landing pad;

a second insulating pattern disposed on the first insulating pattern and disposed between the first lower electrode and the second lower electrode;

a capacitor dielectric layer disposed on the first lower electrode and the second lower electrode; and an upper electrode disposed on the capacitor dielectric layer, wherein the second lower electrode passes through the second metal oxide layer and contacts the second landing pad, the second lower electrode includes a protruding portion that is connected to a main body of the second lower electrode and contacts the third side surface of the second landing pad, and a lateral width of the protruding portion of the second lower electrode is less than a lateral width of the main body of the second lower electrode.

16. The semiconductor device of claim 15, wherein a first lateral width of the second insulating pattern between the second vertical portion of the first metal oxide layer and the protruding portion of the second lower electrode is less than a second lateral width of the second insulating pattern between the first lower electrode and the second lower electrode, and a third lateral width of the second insulating pattern between the second vertical portion of the first metal oxide layer and the third vertical portion of the second metal oxide layer.

17. The semiconductor device of claim 15, wherein the second insulating pattern contacts the first insulating pattern.

18. The semiconductor device of claim 15, wherein the second insulating pattern is in contact with a portion of a lower surface of at least one of the first lower electrode or the second lower electrode.

19. A semiconductor device comprising:

a substrate comprising a plurality of active regions and a plurality of word lines crossing the plurality of active regions and extending in a first direction;

a plurality of bit lines disposed on the substrate and extending in a second direction intersecting the first direction;

a plurality of storage node contacts disposed between the plurality of bit lines and between the plurality of word lines and connected to the plurality of active regions;

a plurality of landing pads disposed on the plurality of storage node contacts;

a plurality of first insulating patterns in contact with lower portions of first side surfaces of the plurality of landing pads;

a plurality of pad oxide layers, each of which having a lateral portion disposed on an upper surface of one of the plurality of landing pads and a vertical portion in contact with an upper portion of a side surface of the one of the plurality of landing pads;

a plurality of second insulating patterns in contact with upper surfaces of the plurality of first insulating patterns and covering the plurality of first insulating patterns and the plurality of pad oxide layers; and a plurality of lower electrodes vertically passing through the plurality of second insulating patterns and in contact with the upper surfaces and upper portions of second side surfaces of the plurality of landing pads, the second side surfaces opposite to the first side surfaces.

20. The semiconductor device of claim 19, wherein an upper surface of each of the plurality of landing pads is disposed between an upper surface of a corresponding one of the storage node contacts and a lower surface of a corresponding one of the lower electrodes in a cross-sectional view.

* * * * *